(12) United States Patent
Yamasaki et al.

(10) Patent No.: US 7,142,575 B2
(45) Date of Patent: Nov. 28, 2006

(54) SEMICONDUCTOR LASER ELEMENT AND OPTICAL DATA RECORDING DEVICE

(75) Inventors: Yukio Yamasaki, Daito (JP); Shigetoshi Ito, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 335 days.

(21) Appl. No.: 10/769,244

(22) Filed: Jan. 30, 2004

(65) Prior Publication Data

US 2004/0201031 A1 Oct. 14, 2004

(30) Foreign Application Priority Data

Jan. 31, 2003 (JP) ............................. 2003-024735
Dec. 3, 2003 (JP) ............................. 2003-404507

(51) Int. Cl.
*H01S 5/00* (2006.01)
(52) U.S. Cl. ............................. 372/43.01; 372/45.01; 372/46.01
(58) Field of Classification Search ............. 372/43.01, 372/45.01, 46.01
See application file for complete search history.

(56) References Cited

U.S. PATENT DOCUMENTS 5,974,068 A * 10/1999 Adachi et al. ........... 372/46.01
2004/0047381 A1 * 3/2004 Tojo et al. .................. 372/46

OTHER PUBLICATIONS

Nagahama, S-i., et al., (2000). "High-Power and Long-Lifetime InGaN Multi-Quantum-Well Laser Diodes Grown on Low-Dislocation-Density GaN Substrates," *Jpn. J. Appl. Phys.* 39:L647-L650.
Tojyo, T. et al. (2002). "High-Power AlGaInN Laser Diodes with High Kink Level and Low Relative Intensity Noise," *Jpn. J. Appl. Phys.* 41:1829-1833.

* cited by examiner

*Primary Examiner*—Minsun Oh Harvey
*Assistant Examiner*—Dung (Michael) T. Nguyen
(74) *Attorney, Agent, or Firm*—Morrison & Foerster LLP

(57) ABSTRACT

A semiconductor laser element has the following structure. In the clad layer, a difference in a light radiation loss between the basic horizontal-lateral mode and the 1st-order horizontal-lateral mode is 10 $cm^{-1}$ or more. The refractive index of the clad layer is below an effective index against light in the basic horizontal-lateral mode, and the refractive index of the clad layer is equal to or more than an effective index against light in the 1st-order horizontal-lateral mode. The upper clad layer is provided only above a portion of the active layer, and thus is at least included in the ridge-stripe structure. This structure inhibits the I-L characteristic from suffering kink and realizes oscillations in the basic horizontal-lateral mode until output power reaches as high as 60–100 mW, in a peak output power of the semiconductor laser element at the time of a pulse current operation. This structure also enables the FFP to have an ellipticity of close to 1, thus making the spot of the semiconductor laser element close to a circular shape.

38 Claims, 19 Drawing Sheets

(a)

(b)

SEMICONDUCTOR LASER ELEMENT AND OPTICAL DATA RECORDING DEVICE

BACKGROUND OF THE INVENTION (1) Field of the Invention

The present invention relates to semiconductor laser elements and devices using the same to optically record or reproduce data. More particularly, the invention relates to an invention useful for nitride semiconductor laser elements.

(2) Description of the Prior Art

Conventionally, studies have been conducted on semiconductor laser elements comprising various semiconductor materials. Semiconductor laser elements now in practical use are mainly those that radiate laser beams of relatively long wavelengths, from red spectrum to green spectrum (e.g., arsenide semiconductor laser elements comprising an arsenide semiconductor material used for the active layer). Such semiconductor laser elements are mainly used as light sources of devices to optically record or reproduce data, or of devices to optically transmit data.

In optical data recording devices, a need for speed enhancement of data recording has led to a growing demand for semiconductor lasers generating stable laser beams at a high output power level. Further, in such recording media, a need for more highly dense data recording has led to a growing demand for semiconductor laser elements that radiate laser beams with short wavelengths.

In common optical data recording devices, a recording manner is one which harnesses the crystal phase change or magnetic phase transition of a material composing the recording layer of a recording medium. Here, energy of the laser beams is used as a heat source in recording data. Thus, high-speed data recording involved a high output power of the laser beams.

However, when the amount of current injected is increased to enhance the output power of the laser beams, semiconductor laser elements are known to oscillate in a high-order horizontal-lateral mode as well as in the basic horizontal-lateral mode. The strength of laser beams oscillating in a high-order horizontal-lateral mode distributes in the spot differently from the strength of laser beams oscillating in the basic horizontal-lateral mode. This can increase the diameter of the spot and change the ellipticity thereof to a value away from 1. In addition, oscillations in different horizontal-lateral modes make it difficult to radiate stable laser beams. As a result, it can be that laser beams are not narrowly focused, the spot of converged laser beams is easily dislocated, and recording density is lessened.

The lateral mode includes the horizontal-lateral mode and the perpendicular-lateral mode, and the horizontal-lateral mode can be problematic when oscillations in a high-order horizontal-lateral mode occur. This is because, in a manufacturing process, length is more accurately processed in the direction of deposition of the semiconductor layers composing the laser structure than in the direction perpendicular to the deposition direction. Thus, oscillations realized are only in the basic perpendicular-lateral mode rather than in a high-order perpendicular-lateral mode. Such element structure is enabled.

Common semiconductor laser elements to radiate laser beams of short wavelengths include nitride semiconductor laser elements to radiate laser beams from blue spectrum to ultraviolet spectrum. Such elements use, as the active layer, nitride semiconductor materials represented by GaN, InN, AlN, or mixed crystal semiconductors thereof In recent years, such elements have been prototyped. Examples include a nitride semiconductor laser element with a continuous wave operation in room temperature (room temperature CW) in the basic horizontal-lateral mode until output power reaches the order of 30 mW, as described in "Extended Abstracts for the 47th meeting of The Japan Society of Applied Physics and Related Societies, 31p-YQ-8." Another example is a nitride semiconductor laser element with a continuous wave operation in room temperature (room temperature CW) in the basic horizontal-lateral mode until output power reaches the order of 30 to 40 mW, as described in "Japanese Journal of Applied Physics, Vol. 39, pp. 647–650, 2000," by Shin-ichi Nagahama et al. The far field pattern (FFP) of this element is that the full angle of half maximum in the perpendicular direction is 25 degree and that in the horizontal direction is 8 degree. Laser beams of short wavelengths can make the spot focused more narrowly (or make the spot diameter narrower) than laser beams of long wavelengths. Thus, attention is paid to optical data recording devices that use nitride semiconductor laser elements as the light sources, in hopes of such devices acting as high density data recording devices of the next generation that might enable high density recording of the recording media, as compared with conventional devices.

Specific techniques to maintain stable oscillations of a semiconductor laser element until output power reaches a high level will now be described below.

Instability due to an asymmetrical distribution of carriers in the horizontal direction and of light intensity in the horizontal direction in the striped region needs to be corrected, and oscillations in a single horizontal-lateral mode (only in the basic horizontal-lateral mode) until output power reaches a high level needs to be realized. For those purposes, AlGaAs semiconductor laser elements are known to employ a light waveguide of what is called an effective refractive index waveguide type (ridge stripe structure). For oscillations to maintain up to a high output power level in the basic horizontal-lateral mode, it is effective to narrow the light waveguide in width (hereinafter referred to as stripe width). It is known, however, that making stripe width too narrow weakens confinement of light in the basic horizontal-lateral mode, and causes a rise in the threshold voltage of the semiconductor laser element. Thus, stripe width has optimum values.

A technique to optimize stripe width can be applied to nitride semiconductor laser elements. The optimum values of stripe width, however, are approximately proportional to the wavelengths of laser oscillations, and thus become as low as 2 μm with nitride semiconductor laser elements, as compared with AlGaAs semiconductor laser elements. Thus, adverse effects on the characteristics of semiconductor laser elements become distinguished as the value of stripe width is set narrower. To sufficiently reduce adverse effects on the characteristics of nitride semiconductor laser elements, a technique to keep the deviation of stripe width within ±0.1 μm from the set value is required. It is, however, technically very difficult to keep a deviation within the range. Therefore, in nitride semiconductor laser elements, oscillations in a single horizontal-lateral mode (only in the basic horizontal-lateral mode) until output power reaches a high level are difficult to realize only by stripe width adjustment.

FIG. 11 is a schematic section of the structure of a conventional semiconductor laser element. The direction perpendicular to the drawing is that of the resonator (axis direction). This semiconductor laser element has a substrate 1101, a lower clad layer 1103, a lower light waveguide layer 1104, an active layer 1105 having a triple quantum well structure, a carrier block layer 1106, an upper light waveguide layer 1107, an upper clad layer 1108, and a contact layer 1109 deposited in this order. The upper clad layer 1108 has on its center a striped protruding portion whose sectional shape is convex. The contact layer 1109 is only formed on approximately the entire surface of the protruding portion of the upper clad layer 1108. The protruding portion of the upper clad layer 1108 and the contact layer 1109 consist the ridge-stripe structure of this semiconductor laser element. The ridge-stripe structure is formed by using photolithography and etching techniques after forming an upper clad film to be formed into the upper clad layer 110 and a contact film to be formed into the contact layer 1109. The etched regions of the contact layer are completely removed, and the etched regions of the upper clad layer are left with a predetermined thickness. In this semiconductor laser element, light emitted from the active layer 1105 is confined in the waveguide structure, where then there are laser oscillations.

This semiconductor laser element further has a buried layer 1110 that is formed in the approximately entire etched regions and is approximately transparent for light with the oscillation wavelength, an electrode 1112 formed over the approximately entire surfaces of the contact layer 1109 and the buried layer 1110, and an electrode 1111 formed on the approximately entire surface of two main surfaces of the substrate 1101. The surface with the electrode 1111 is opposite to the other surface on which the lower clad layer 1103 is formed. The both end surfaces of the ridge-stripe structure are those of the resonator and serve as the mirrors to the resonator.

FIG. 12 is a conceptual section of the structure of a conventional semiconductor laser element. This semiconductor laser element is similar to the semiconductor laser element of FIG. 11, except that the substrate used is a sapphire substrate 1201, and that a negative electrode 1211 is formed in the region that results from photolithography and etching and contacts the lower clad layer 1203.

In a semiconductor laser element having a structure such as one shown in FIG. 11, known methods to improve oscillations through up to a high output power level in a single horizontal-lateral mode (only in the basic horizontal-lateral mode) include adjustment of the total thickness (residual thickness after etching) of the upper clad layer 1108 outside the ridge-stripe region and the upper light waveguide layer 1107.

An increase in the residual thickness after etching narrows a difference in a local effective index between the regions within and outside the striped region, and lessens the horizontally-directed confinement coefficient of light in the 1st-order horizontal-lateral mode, as compared with the basic horizontal-lateral mode. However, an excessive increase in the residual thickness after etching lessens the horizontally-directed confinement coefficient of light in the basic horizontal-lateral mode, causing a rise in the threshold voltage of the semiconductor laser element. Further, an excessive increase in a residual thickness after etching horizontally widens the intensity distribution of emitted light, and causes the far field pattern (FFP) of the radiated laser beam to be such that the full angle of half maximum in the horizontal direction is narrowed. This causes the radiated laser beam to deteriorate its ellipticity (in the FFP, ratio of the full angle of half maximum in the perpendicular direction to that in the horizontal direction). If such semiconductor laser element is installed in optical data recording/reproducing devices, the connecting efficiency of laser beams to the optical system decreases. Thus, the residual thickness after etching has optimum values and is determined uniquely. Generally, the residual thickness after etching is set 0.001–0.15 μm thicker than the p-type guiding layer.

Another example of known methods to realize oscillations in a single horizontal-lateral mode (only in the basic horizontal-lateral mode) through up to a high output power is the use of absorption material to be formed into the buried layer 1110 in the nitride semiconductor laser element shown in FIG. 11 so that light radiated from the active layer 1105 can be absorbed by the absorption material. This is disclosed in, for example, "Japanese Journal of Applied Physics, Vol. 41, pp. 1829–1833, 2002" by Tsuyoshi Tojyo et al. In the nitride semiconductor laser element described in this non-patent document 3, the buried layer 1110 in the nitride semiconductor laser element shown in FIG. 11 is an adsorption layer made of oxidized silicon ($SiO_2$), or is an adsorption layer having a two-layer structure of several tens of nanometers consisting of an oxidized silicon ($SiO_2$) layer and a silicon (Si) layer.

FIG. 17 is a schematic view of the basic configuration of a conventional optical data recording/reproducing device 1708. This device 1708 is composed of a semiconductor laser element 1701, a collimating lens 1702, a beam splitter 1703, an objective lens 1704, a light detecting system 1706 to detect light, and a molded prism 1707. The semiconductor laser element used here is a conventional one.

In the recording operation, a laser beam emitted from the semiconductor laser element is converted into parallel light or nearly parallel light by the collimating lens, collected by the objective lens through the beam splitter, and then radiated to the data recording surface of a light disk 1705. Bit data is written onto the data recording surface of the light disk 1705 with the projections and depressions, and magnetic modulation or refractive index modulation. In the erasing operation, through the same passage as the recording operation, a laser beam is radiated to the data recording surface of the light disk to erase the recorded bit data. In the reproducing operation, through the same passage as the recording and erasing operations, a laser beam emitted from the semiconductor laser element is radiated to the data recording surface of the light disk on which bit data is written with the projections and depressions, and magnetic modulation or refractive index modulation. Then, the laser beam is reflected by the reflecting surface of the light disk and transmitted through the objective lens and the beam splitter, before entry into the light detecting system. The light detecting system converts the detected light into an electrical signal and reads the recorded data.

Ellipticity of laser beams emitted from conventional semiconductor laser elements is so high that a correction (to make ellipticity close to 1) has been needed with a molded prism before radiation to the light disk.

SUMMARY OF THE INVENTION

The present inventors fabricated 100 pieces of the conventional nitride semiconductor laser element (hereinafter referred to as a sample laser element A) shown in FIG. 11. Each of the sample laser elements A had an n-type GaN substrate (3 μm thick) as the substrate 1101, an n-type $Al_{0.07}Ga_{0.93}N$ layer (0.5 μm thick) as the lower clad layer 1103, an n-type GaN layer (0.1 μm thick) as the light waveguide layer 1104, an $In_{0.10}Ga_{0.90}N$ layer (4 μm thick) as the quantum well layer of the active layer 1105 having a triple quantum well structure, an n-type $In_{0.90}Ga_{0.02}N$ layer (8 nm thick) as the barrier layer of the active layer 1105, a p-type $Al_{0.20}Ga_{0.80}N$ layer (20 nm thick) as the carrier block layer 1106, a p-type GaN layer (0.1 μm thick) as the upper light waveguide layer 1107, a p-type $Al_{0.07}Ga_{0.93}N$ layer (0.5 μm thick) as the upper clad layer 1108, and a p-type GaN layer (0.1 μm thick) as the contact layer 1109. The stripe width of the ridge-stripe structure was set at 2 μm.

FIG. 13 shows the injection-current and light-output characteristic (hereinafter referred to as an I-L characteristic) of a semiconductor laser element. The sharp line is an example of an I-L characteristic that keeps linearity until output power reaches 90 mW. When a current exceeds a predetermined value (threshold current $I_{th}$), oscillations in the basic horizontal-lateral mode commence. Even when the current is further raised, output power increases up to 90 mW as drawing a straight line. Such I-L characteristic is an ideal case. On the other hand, the bold line is a typical I-L characteristic of the sample laser element A. Oscillations commence in the basic horizontal-lateral mode when a current exceeds a predetermined value (threshold current $I_{th}$). However, when a current is further raised, the increase of output power does not draw an entirely straight line. A portion that fails linearity is generally referred to as kink, and an output power value at which kink occurs is referred to as a kink level ($P_k$).

The present inventors studied 90 sample laser elements A whose I-L characteristics had kink, and confirmed that the occurrence of kink was attributed to a change in the horizontal-lateral mode (from the basic horizontal-lateral mode to the 1st-order horizontal-lateral mode). This confirmation means that, under a direct current, 10 sample laser elements A had oscillations in the basic horizontal-lateral mode until output power reached 60 mW, and that the remaining elements having I-L characteristics with kink had oscillations in a high-order horizontal-lateral mode within the above output power range. Thus, in the manufacture of such elements, the yield is as low as 10 percent, increasing manufacturing costs.

Also, it was confirmed that all the 90 sample laser elements A whose I-L characteristics suffered kink had a change in the far field pattern (FFP) in the horizontal direction starting from the portion (kink level) at which the I-L characteristic showed kink.

FIGS. 14(a) and 14(b) describe a change with output power in the FFPs in the horizontal direction of nitride semiconductor laser elements. FIG. 14(a) shows the FFP in the horizontal direction of a nitride semiconductor laser element. Reference numerals 1401 and 1402 denote the FFPs in the horizontal direction with an output power lower than the kink level. Reference numerals 1403 and 1404 denote the FFPs in the horizontal direction with an output power exceeding the kink level. In this example, a fluctuation was observed in the point of the peak starting from the kink level output power. FIG. 14(b) shows the FFP in the horizontal direction of another nitride semiconductor laser element. Reference numerals 1405 and 1406 denote the FFPs in the horizontal direction with an output power lower than the kink level. Reference numerals 1407 and 1408 denote the FFPs in the horizontal direction with an output power exceeding the kink level.

The present inventors fabricated a sample laser element B. In place of the transparent buried layer of the sample laser element A, this element B had a buried layer made of material that absorbs light originating from the active layer. Specifically, oxidized silicon ($SiO_2$) was used to form the buried layer of the sample laser element B. Using this sample laser element B, a study was conducted as to how the thickness of the oxidized silicon layer related to a propagation loss by absorption of the buried layer, and how the residual thickness after etching related to a propagation loss by absorption of the buried layer.

FIG. 15 shows a plotted graph of a propagation loss by absorption of the buried layer both in the basic horizontal-lateral mode and the 1st-order horizontal-lateral mode in relation to the thickness of the $SiO_2$ layer. The solid line corresponds to the basic horizontal-lateral mode, and the broken line to the 1st-order horizontal-lateral mode. The 1st-order horizontal-lateral mode, where a relatively high proportion of electric field intensity is distributed outside the striped region as compared with the basic horizontal-lateral mode, is substantially affected by absorption of the buried layer. That is, a difference in a propagation loss can be made large between the basic horizontal-lateral mode and the 1st-order horizontal-lateral mode.

To maintain laser beams in the basic horizontal-lateral mode until output power reaches a high level, and to sufficiently cut down on laser beams in the 1st-order horizontal-lateral mode, the difference of a propagation loss needs to be at least 10 $cm^{-1}$, or more is preferable. In this structure, the thinner the thickness of the $SiO_2$ layer becomes, the more a propagation loss increases exponentially both in the basic horizontal-lateral mode and the 1st-order horizontal-lateral mode. Thus, an attempt to acquire a larger difference in a propagation loss involves a larger propagation loss in the basic horizontal-lateral mode. If a propagation loss in the basic horizontal-lateral mode exceeds about 2 $cm^{-1}$ (one tenth of an addition of a 10 $cm^{-1}$ propagation loss by other factors and a 10 $cm^{-1}$ mirror loss), then there is a noticeable rise in the threshold current of the semiconductor laser element, and there is a noticeable fall in a slope efficiency (in the I-L characteristic, the slope of the characteristic straight line in the region of laser oscillations). This causes a rise in an operation current. Under these conditions, it is impossible to make the $SiO_2$ layer thinner than a certain value.

FIG. 16 shows a plotted graph of a propagation loss by absorption of the buried layer both in the basic horizontal-lateral mode and the 1st-order horizontal-lateral mode in relation to the residual thickness after etching. The solid line corresponds to the basic horizontal-lateral mode, and the broken line to the 1st-order horizontal-lateral mode. Although the lines show a monotonous increase in accordance with an increase in the residual thickness after etching, a propagation loss in the basic horizontal-lateral mode becomes large at the same time. If a propagation loss in the basic horizontal-lateral mode exceeds about 2 $cm^{-1}$, then there is a noticeable rise in the threshold current of the semiconductor laser element, and there is a noticeable fall in a slope efficiency, causing a rise in an operation current. Such adverse effects are the same as those in FIG. 15. Also, an increase in the residual thickness after etching lessens horizontally-directed confinement of light in the basic horizontal-lateral mode, causing an increase in a threshold current density and a decrease in the full angle of half maximum in the FFP in the horizontal direction. This causes the ellipticity of the FFP to rise. If such semiconductor laser element is installed in optical data recording/reproducing devices, the elliptic spot of collected laser beams becomes flatter, causing crosstalks.

Thus, in conventional nitride semiconductor laser elements, it has been impossible to secure a propagation loss difference of 10 $cm^{-1}$ or more between the basic horizontal-lateral mode and the 1st-order horizontal-lateral mode while keeping the propagation loss of the basic horizontal-lateral mode under 2 $cm^{-1}$.

For the reasons described above, as a method to realize oscillations of nitride semiconductor laser elements in the basic horizontal-lateral mode through up to a high output power level, it is insufficient merely to optimize stripe width and make the residual thickness after etching larger, or to use absorption material as the buried layer. Thus, there has been a need for a new method.

In view of the foregoing and other problems, it is an object of the present invention to provide a novel method to inhibit kink found in the I-L characteristic, and to provide a semiconductor laser element that has oscillations in the basic horizontal-lateral mode through up to a high output power level of 60–100 mW when driven under a pulse current. It is another object of the invention to improve the far field pattern (FFP) by making ellipticity close to 1.

According to a first aspect of the present invention, there is provided a semiconductor laser element having a ridge-stripe structure to confine light in the horizontal direction. The semiconductor laser element comprises a substrate, a first conductivity type lower clad layer formed above the substrate, and a second conductivity type upper clad layer formed above the lower clad layer. The second conductivity type is different from the first conductivity type. The semiconductor laser element also comprises an active layer provided between the lower clad layer and the upper clad layer. In at least either the lower clad layer or the upper clad layer, a difference in a radiation loss of light, generated in the active layer, between the basic horizontal-lateral mode and the 1st-order horizontal-lateral mode is 10 cm$^{-1}$ or more. The propagation loss of light is directed toward a main side of at least either the lower clad layer or the upper clad layer, and this main side is opposite to the active layer side.

According to a second aspect of the present invention, there is provided a semiconductor laser element having a ridge-stripe structure to confine light in the horizontal direction. The semiconductor laser element comprises a substrate, a first conductivity type lower clad layer formed above the substrate, and a second conductivity type upper clad layer formed above the lower clad layer. The second conductivity type is different from the first conductivity type. The semiconductor laser element also comprises an active layer provided between the lower clad layer and the upper clad layer. In this semiconductor laser element, when the effective index against light, generated in the active layer, in the basic horizontal-lateral mode is taken as n$_0$, and when the effective index against light, generated in the active layer, in the 1st-order horizontal-lateral mode is taken as n$_1$, then equal to or more than n$_1$ and below n$_0$.

According to a third aspect of the present invention, there is provided a semiconductor laser element having a ridge-stripe structure to confine light in a horizontal direction. The semiconductor laser element comprises a substrate, a first conductivity type lower clad layer formed above the substrate, and a second conductivity type upper clad layer formed above the lower clad layer. The second conductivity type is different from the first conductivity type. The semiconductor laser element also comprises an active layer provided between the lower clad layer and the upper clad layer. In this semiconductor laser element, the upper layer is provided above a portion of the active layer and is at least included in the ridge-stripe structure.

According to the present invention, there is provided an optical data recording device for recording data provided in the form of an electrical signal into a light recording medium. This optical data recording device comprises a semiconductor laser element according to the present invention, recording light radiating control means for allowing radiation of a laser beam for recording from the semiconductor laser element in accordance with the electrical signal, light focusing means for focusing a laser beam radiated from the semiconductor laser element, and irradiating position control means for recording data by irradiating a particular position of a light recording medium with a laser beam collected by the light collecting means.

This application claims priority under 35 U.S.C. §119(a) on Patent Application Nos. 2003-024735 filed in Japan on Jan. 31, 2003, and 2003-404507 filed in Japan on Dec. 3, 2003, the entire contents of which are hereby incorporated by reference.

DESCRIPTION OF THE PREFERRED EMBODIMENTS

Embodiments of the present invention will be described. The following provides an overview of a semiconductor laser element and an optical data recording/reproducing device according to the present invention. Detailed descriptions are provided in [Embodiment 1] to [Embodiment 5].

Figure 1:
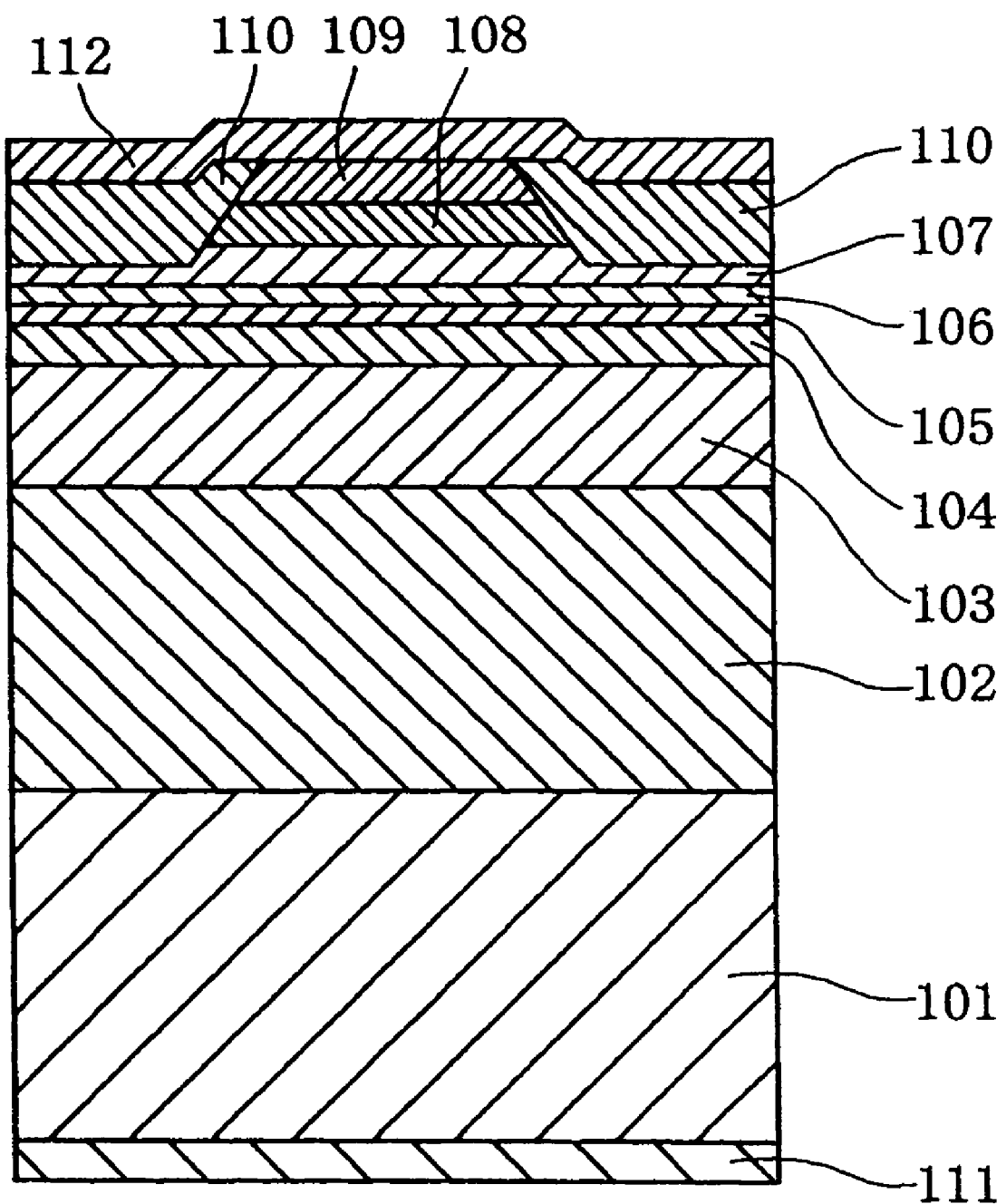
FIG. 1 is a schematic sectional view of a semiconductor laser element showing an example of the structure thereof.

A semiconductor laser element according to the present invention is described with reference to a semiconductor laser element shown in FIG. 1. FIG. 1 is a schematic section of a semiconductor laser element of the present invention showing an example of the structure thereof. The section is perpendicular to the resonator direction of the semiconductor laser element.

The semiconductor laser element shown in FIG. 1 has a first conductivity type substrate 101, a first-conductivity-type-oriented electrode 111 on the lower surface of the substrate 101, a first conductivity type base layer 102 on the upper surface of the substrate 101, a first conductivity-type lower clad layer 103 on the upper surface of the base layer 102, a first conductivity-type lower light waveguide layer 104 on the upper surface of the lower clad layer 103, an active layer 105 on the upper surface of the lower light waveguide layer 104, a carrier block layer 106 on the upper surface of the active layer 105, a second conductivity type upper light waveguide layer 107 on the upper surface of the carrier block layer 106 and with a center portion having a striped-shaped protruding portion that protrudes upward beyond other portions of the upper light waveguide layer 107, a second conductivity-type upper clad layer 108 on the upper surface of the protruding portion of the upper light waveguide layer 107, a second conductivity type contact layer 109 on the upper surface of the upper clad layer 108, buried layers 110 provided on either sides of a ridge-stripe structure composed of the protruding portion of the upper light waveguide layer 107, the upper clad layer 108, and the contact layer 109, and a second-conductivity-type-oriented electrode 112 over the upper surfaces of the contact layer 109 and the buried layers 110. Such construction is referred to as a construction A.

The first conductivity type and the second conductivity-type used here denote a p-type or an n-type. When the first conductivity-type is the p-type, then the second conductivity type is the n-type. When the first conductivity-type is the n-type, then the second conductivity-type is the p-type.

In the semiconductor laser element according to the present invention, the first-conductivity-type-oriented electrode 111 and the second-conductivity-type-oriented electrode 112 are not essential. Generally, however, to secure an electrical connection with voltage applying means (current supply) for driving the semiconductor laser element, the first-conductivity-type-oriented electrode 111 and the second-conductivity-type-oriented electrode 112 are formed in the semiconductor laser element. The first-conductivity-type-oriented electrode 111 and the second-conductivity-type-oriented electrode 112 each may be a single layer electrode made of a single metal material or alloy material, or may be a deposited electrode made of different metal materials or alloy materials.

The first aspect of the semiconductor laser element according to the present invention provides the following condition. In at least either the lower clad layer 103 or the upper clad layer 108, a difference in a radiation loss of light, generated in the active layer 105, between the basic horizontal-lateral mode and the 1st-order horizontal-lateral mode is 10 $cm^{-1}$ or more, with the radiation loss of light being directed toward a main side of at least either the lower clad layer or the upper clad layer, and the main side being opposite to an active layer side. As long as this condition is met, the construction (construction A) shown in FIG. 1 may be replaced with a construction B or a construction C. The construction B is that the upper light waveguide layer 107 is a flat layer without a protruding portion. The construction C is that the upper light waveguide layer is flat without a protruding portion, and the clad layer has on its center portion a stripe-shaped protruding portion that protrudes upward beyond the other portions of the clad layer.

In the construction A, the base layer 102, the lower light waveguide layer 104, the carrier block layer 106, and the contact layer 109 are not essential. In the construction B or the construction C, the base layer, the lower light waveguide layer, the carrier block layer, the upper light waveguide layer, and the contact layer are not essential. However, for a semiconductor laser element to have high performance, it is preferable to provide the lower light waveguide layer 104, the carrier block layer 106, the upper light waveguide layer 107, and the contact layer 109. In a nitride semiconductor laser element, it is preferable to provide the base layer 102, since no known substrate can secure formation of a nitride semiconductor laser layer with good crystallinity, unlike arsenide semiconductor laser elements.

The second aspect of the semiconductor laser element according to the present invention provides the following condition. In at least either the lower clad layer 103 or the upper clad layer 108, a refractive index of at least either the lower clad layer or the upper clad layer is below an effective index against light, generated in the active layer 105, in the basic horizontal-lateral mode, and equal to or more than the effective index against light, generated in the active layer 105, in the 1st-order horizontal-lateral mode. As long as this condition is met, the construction (construction A) shown in FIG. 1 may be replaced with a construction B or a construction C. The construction B is that the upper light waveguide layer 107 is a flat layer without a protruding portion. The construction C is that the upper light waveguide layer is flat without a protruding portion, and the clad layer has on its center portion a stripe-shaped protruding portion that protrudes upward beyond the other portions of the clad layer.

With the construction of the second aspect, light in the 1st-order horizontal-lateral mode is given priority, over light in the basic horizontal-lateral mode, of radiation outside the lower clad layer 103 or the upper clad layer 108. This inhibits kink in the I-L characteristic curved line, and realizes oscillations in the basic horizontal-lateral mode until output power reaches a high level.

Also in the second aspect, the construction A may not essentially have the base layer 102, the lower light waveguide layer 104, the carrier block layer 106, and the contact layer 109. In the construction B or the construction C, the base layer, the lower light waveguide layer, the carrier block layer, the upper light waveguide layer, and the contact layer are not essential. However, for a semiconductor laser element to have high performance, it is preferable to provide the lower light waveguide layer 104, the carrier block layer 106, the upper light waveguide layer 107, and the contact layer 109.

In the third aspect of the semiconductor laser element according to the present invention, the construction (construction A) shown in FIG. 1 may be replaced with the construction B, where the upper light waveguide layer 107 is a flat layer without a protruding portion. It should be noted that the base layer 102, the lower light waveguide layer 104, the carrier block layer 106, and the contact layer 109 are not essential in the third aspect of the semiconductor laser element. However, for a semiconductor laser element to have high performance, it is preferable to provide these layers.

Figure 12:
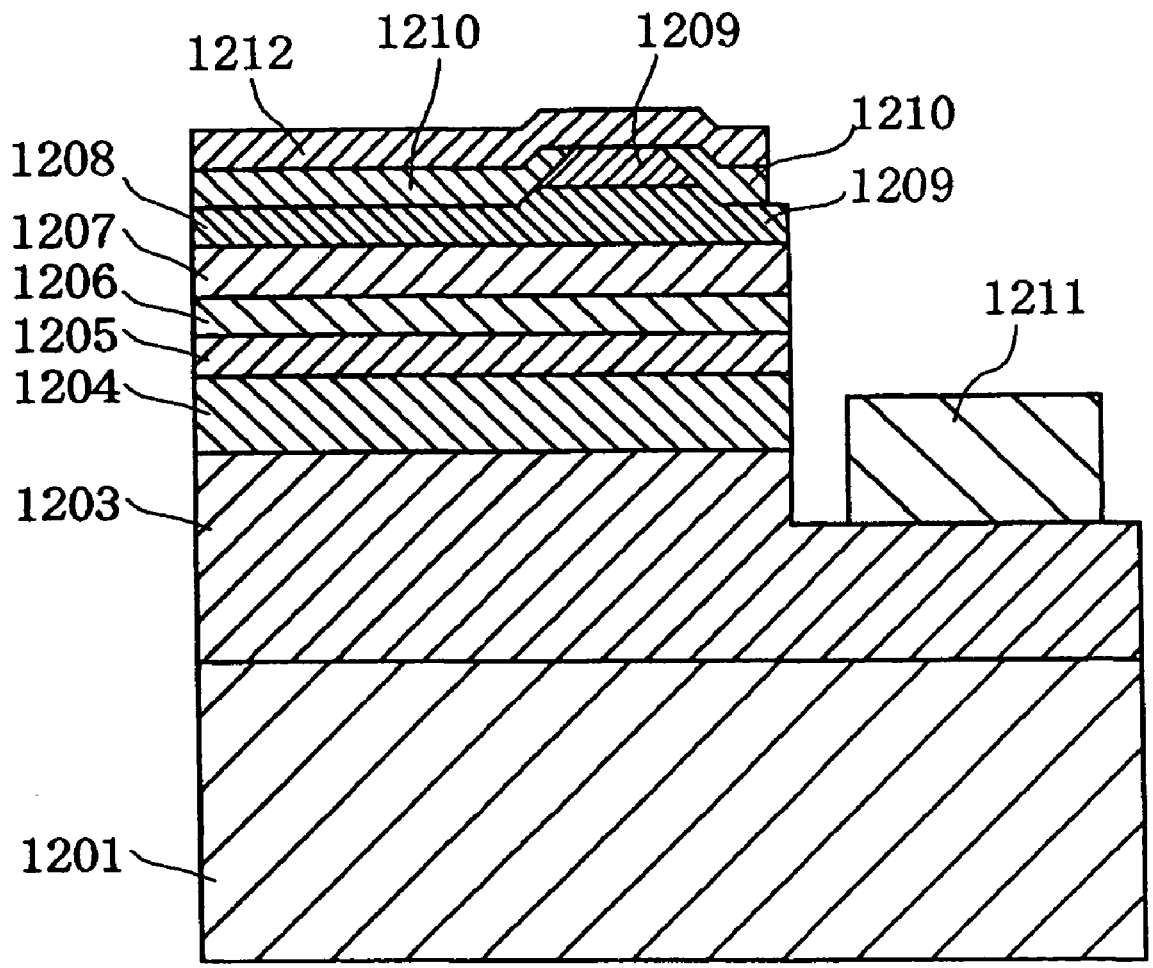
FIG. 12 is a schematic sectional view of a conventional semiconductor laser element showing the structure thereof.
Figure 13:
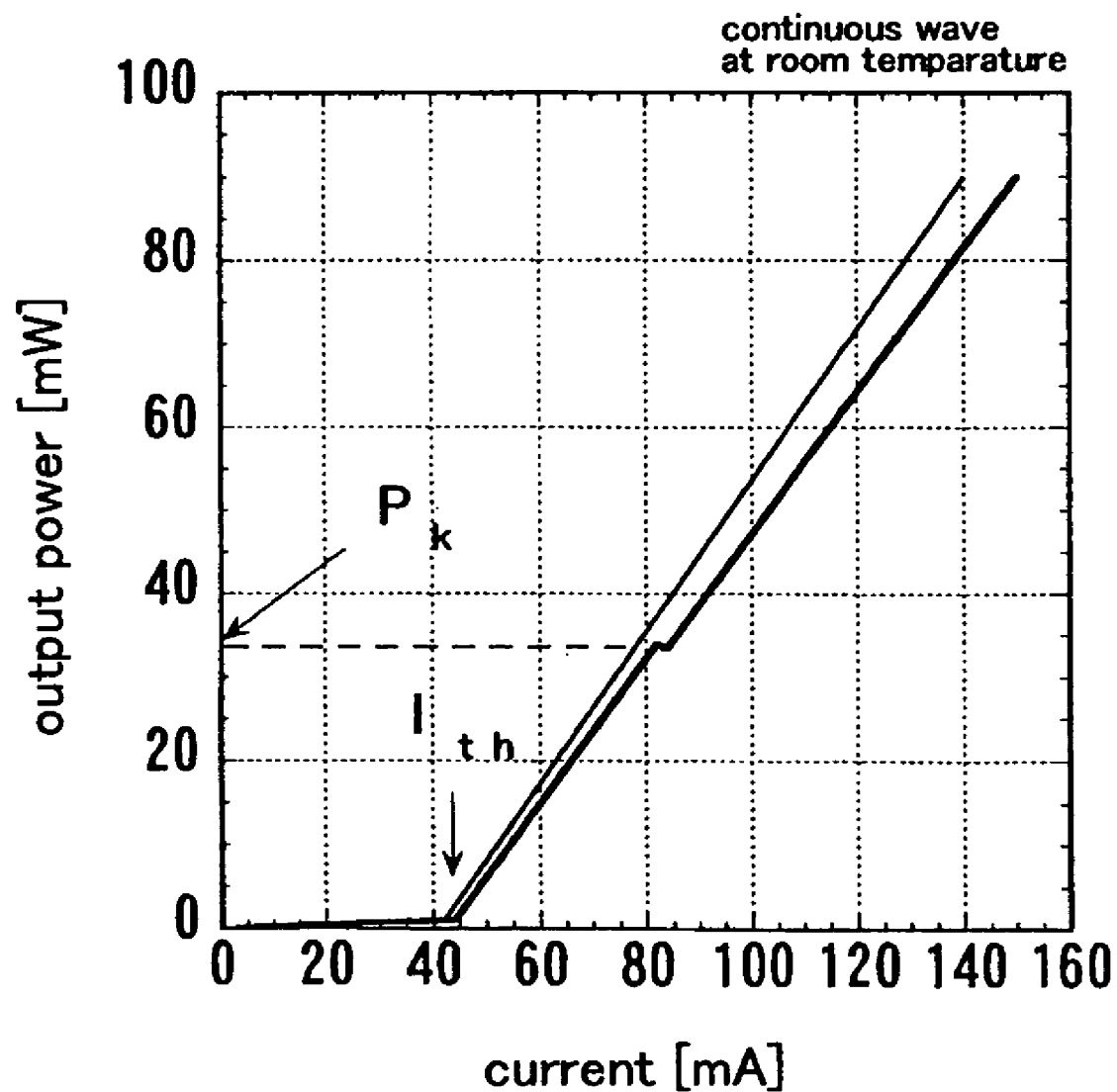
FIG. 13 is a view illustrating the injection-current and light-output (I-L characteristic) of a conventional semiconductor laser element.
Figure 14:
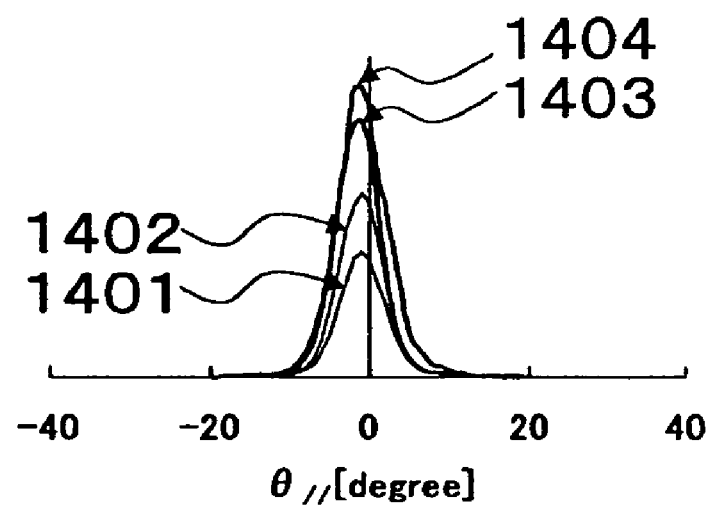
FIGS. 14(a) and 14(b) are views illustrating a change with output power in the FFPs in the horizontal direction of conventional nitride semiconductor laser elements, with FIG. 14(a) showing a first example of the FFP in the horizontal direction of a nitride semiconductor laser element, and FIG. 14(b) showing a second example of the FFP in the horizontal direction of another nitride semiconductor laser element.
Figure 14:
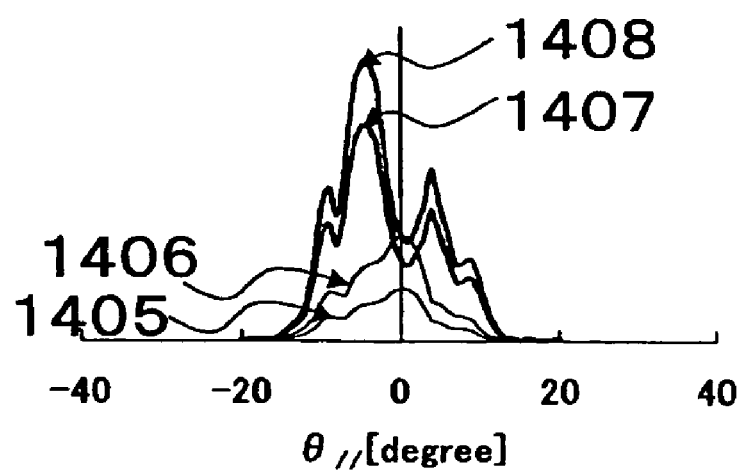
Figure 15:
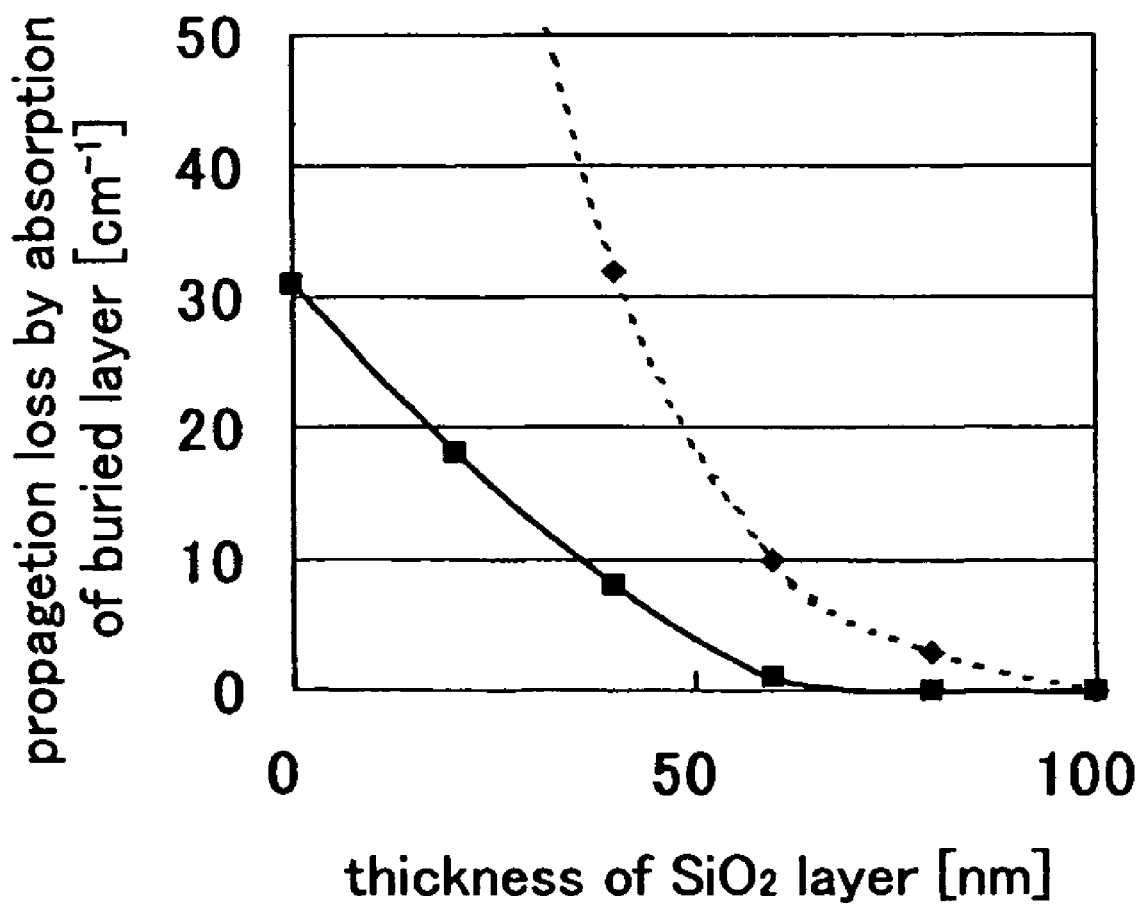
FIG. 15 is a plotted graph of a propagation loss by absorption of the buried layer both in the basic horizontal-lateral mode and the 1st-order horizontal-lateral mode in accordance with the thickness of the $SiO_2$ layer, in a conventional semiconductor laser element.
Figure 16:
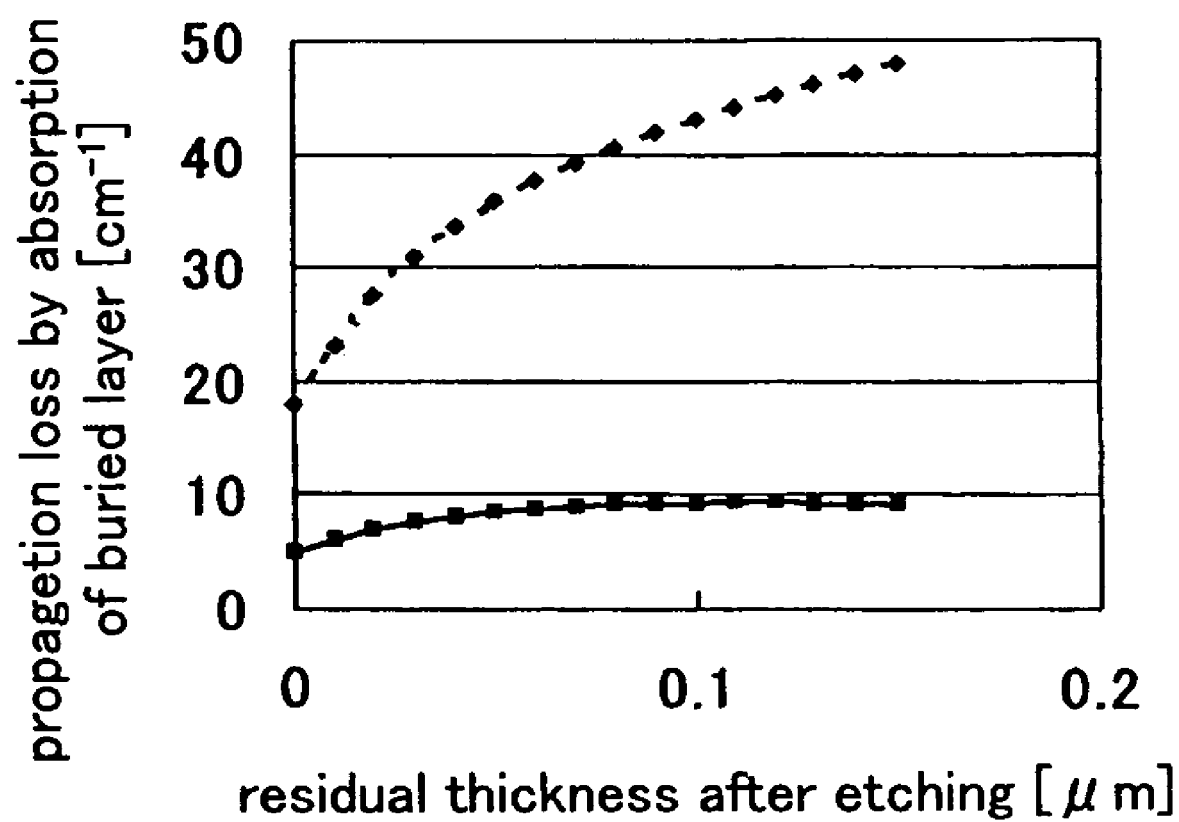
FIG. 16 is a plotted graph of a propagation loss by absorption of the buried layer both in the basic horizontal-lateral mode and the 1st-order horizontal-lateral mode in accordance with the residual thickness after etching, in a conventional semiconductor laser element.

In the semiconductor laser element with the construction A, although the first-conductivity-type-oriented electrode 111 is formed on the lower surface of the substrate, the first electrode may be formed on the upper surface of the lower clad layer, as shown in FIG. 12. Such construction is referred to as a construction D. As the substrate in the construction D, a non-conductive substrate may be used. The construction D can be applied to the first, second, and third aspects of the semiconductor laser element.

In the semiconductor laser element according to the present invention, the active layer may be a single layer made of a single material or may be a deposition of a plurality of layers of different materials. Examples of the active layer composed of a plurality of deposited layers include active layers having a single quantum well structure and active layers having a multiple quantum well structure. An active layer of a single quantum well structure has one quantum well layer sandwiched between barrier layers. An active layer of a multiple quantum well structure has a deposition of alternate quantum well layers and barrier layers, with the uppermost and lowermost layers being barrier layers (barrier layer/quantum well layer/barrier layer/ . . . /quantum well layer/barrier layer).

Examples of the semiconductor laser element according to the present invention include nitride semiconductor laser elements, arsenide semiconductor laser elements, selenide semiconductor laser elements, and phosphide semiconductor laser elements. Nitride semiconductor laser elements are those having an active layer made of a nitride semiconductor. The other semiconductor laser elements are likewise defined.

Nitride semiconductors generally denote crystals composed of $Al_p In_q Ga_{1-p-q} N$ ($0 \leq p \leq 1$, $0 \leq q \leq 1$, $0 \leq p+q \leq 1$). However, the nitride semiconductors used herein may not necessarily be crystals composed of $Al_p In_q Ga_{1-p-q} N$. For example, other crystals usable include those of group III atoms (Al, In, and Ga) part (20 atom percent or less) of which is replaced with B, Cr, V, Ti, Nb, Ta, Zr, Sc, Ti, Gd, or La; those of N atoms, of group VI atoms, part (20 atom percent or less) of which is replaced with P, As, or Sb; and crystals in which impurities such as B, Al, In, Tl, P, As, Sb, Be, Mg, Cd, Zn, C, Si, Ge, Sn, 0, S, Se, Te, H, Sc, Cu, Fe, Ti, V, Cr, Y, Zr, Nb, or lanthanoid is added to the above-mentioned crystals. Also, the n-type nitride semiconductors and the p-type nitride semiconductors used herein are defined as containing impurities to specify the types of conductivity for nitride semiconductors.

In the semiconductor lasers with the constructions A and B, where effective indexes against the basic horizontal-lateral mode and the 1st-order horizontal-lateral mode are lower than those against the construction C, light in the 1st-order horizontal-lateral mode is given priority, over light in the basic horizontal-lateral mode, of radiation toward the lower clad layer 103 and the upper clad layer 108. This inhibits oscillations in the 1st-order horizontal-lateral mode. In the setting of the residual thickness after etching, it is preferable that effective index against the 1st-order horizontal-lateral mode be lower than the refractive index of the lower clad layer 103 (or the upper clad layer 108), and an effective index against the basic horizontal-lateral mode be higher than the refractive index of the lower clad layer 103 (or the upper clad layer 108). This is further detailed in Embodiment 2 based on a specific semiconductor laser element.

In the semiconductor laser element according to the present invention, it is preferable that the refractive index of at least either the lower clad layer 103 or the upper clad layer 108 be lower than an effective index against the basic-horizontal-lateral-mode light generated in the active layer 105, and be equal to or higher than an effective index against 1st-order-horizontal-lateral-mode light generated in the active layer 105. This imparts light in the 1st-order horizontal-lateral mode priority, over light in the basic horizontal-lateral mode, of radiation from the clad layer that meets the above-mentioned condition. As a result, oscillations in the 1st-order horizontal-lateral mode are inhibited. This is further detailed in Embodiment 2 based on a specific semiconductor laser element.

In the semiconductor laser element according to the present invention, the refractive indexes of the lower clad layer 103 and the upper clad layer 108 may be the same or different. Disparateness of a refractive index between the lower clad layer 103 and the upper clad layer 108 promotes a radiation loss toward either of the clad layers with the higher refractive index.

Generally, a radiation loss is preferably promoted toward the lower clad layer 103, whose distance between the first-conductivity-type-oriented electrode 111 is longer than the distance between the upper clad layer 108 and the second-conductivity-type-oriented electrode 112. This is because light reflected by the first-conductivity-type-oriented electrode 111 and the second-conductivity-type-oriented electrode 112, both having good reflectivity, has a lower probability of returning to the active layer 105 when such light is radiated toward the lower clad layer 103 side than when radiated toward the upper clad layer 108 side. Also, promotion of a radiation loss toward the lower clad layer 103 side makes ellipticity closer to 1 than when a radiation loss is promoted toward the upper clad layer 108 side.

In the semiconductor laser element according to the present invention, when the refractive index of the substrate 101 is equal to or more than an effective index against the 1st-order horizontal-lateral mode, light can be radiated through the substrate 101. It is therefore preferable that the substrate 101 used meet this condition and the refractive index of the lower clad layer 103 be higher than that of the upper clad layer 108.

In the semiconductor laser element according to the present invention, an absorption layer having an absorption coefficient of 100 cm$^{-1}$ or more with respect to light generated in the active layer may be provided at a distance of 0.1 µm or less from the active-layer-side surface of either the lower clad layer 103 or the upper clad layer 108 with the higher refractive index. With such construction, where the absorption layer is provided on the clad layer side toward which a radiation loss is promoted, an adsorption loss due to this absorption layer further promotes the propagation loss difference between the basic horizontal-lateral mode and the 1st-order horizontal-lateral mode. Alternatively, the clad layer with the higher refractive index may be separated to provide an absorption layer in between.

In the semiconductor laser element according to the present invention, the substrate 101 may have the ability of absorbing light generated in the light emitting layer 105. Such construction eliminates the need for providing an absorption layer and enables good absorption of light radiated toward the lower clad layer 103 side.

In the semiconductor laser element according to the present invention, the lower clad layer 103 may comprise a first lower clad layer, a second lower clad layer, and a third lower clad layer deposited in this order starting from the substrate side, and the second lower clad layer may have a lower refractive index than refractive indexes of the first and third second lower clad layers. Also, it is preferable that the refractive indexes of the first and third second lower clad layers be lower than an effective index against basic-horizontal-lateral-mode light generated in the active layer. This is detailed in Embodiment 2 based on a specific semiconductor laser element structure.

In the semiconductor laser element according to the present invention, the buried layers 110 may be buried layers capable of absorbing light radiated from the active layer. Such prior art technique may be incorporated. This further inhibits oscillations in the 1st-order horizontal-lateral mode.

Word definitions that might be of help in understanding the present invention will be provided below. In the present specification, "the perpendicular direction" refers to the thickness direction of the semiconductor layer. Also, "the horizontal direction" refers to the direction perpendicular to the thickness orientation of the semiconductor layer and parallel to the resonator surface.

The term "stripe width" used herein is defined as an average width of the upper side (the farther side from the substrate) and lower side (the nearer side from the substrate) of a section of the ridge stripe perpendicular to the longitudinal direction of the resonator.

The term "local effective index within the stripe" used herein is defined as a local effective index obtained by a common calculation of an electric field distribution under the assumption that there is an imaginary slab waveguide that has a refractive index distribution in the direction perpendicular to the inside of the stripe and that has the same refractive index distribution in the horizontal direction as that in the perpendicular direction. How to obtain a "local effective index outside the stripe" will be detailed later.

The horizontal-lateral mode is defined as a mode obtained by a common calculation of an electric field distribution under the assumption that within the stripe width W there is an imaginary slab waveguide whose refractive index distribution is determined by a local effective index distribution n (y) shown in Formula 1 below. The basic horizontal-lateral mode and the 1st-order horizontal-lateral mode respectively denote the basic mode and the 1st-order mode in the horizontal-lateral mode.

$$n(y)=N_{in}\ (|y|\leq W),\ N_{out}\ (|y|>W) \quad \text{[Formula 1]}$$

A horizontally-directed confinement coefficient [☐ denotes an amount defined by Formula 3, where I (y) is the horizontally-directed distribution of light intensity in the horizontal-lateral mode, and the inside of the stripe width in the semiconductor laser element is specified according to Formula 2.

$$|y|\leq W/2 \quad \text{[Formula 2]}$$

$$\Gamma_{\parallel} = \frac{\int_{-W/2}^{W/2} I(y)dy}{\int_{-\infty}^{\infty} I(y)dy} \quad \text{[Formula 3]}$$

The calculation of an electric field distribution denotes a common calculation of an electric field distribution in a slab waveguide. Reference can be made to, for example, "Japanese Journal of Applied Physics, Vol. 84, pp. 1196–1203, 1998," by M. J. Bergmann and H. C. Casey, Jr. The refractive index n, a parameter in the calculation of an electric field distribution, of each of the materials against an oscillation wavelength λ [nm] can be obtained as follows. An oscillation wavelength λ [nm] can be set within the range 300–800 nm. For example, the parameter Eg [eV] of a nitride semiconductor material is obtained by Formula 4.

For $In_sGa_{1-s}N$ ($0\leq s\leq 1$), $Eg=Eg1[s]=3.42(1-s)+2.65s-3.94s(1-s);$

For $Al_tGa_{1-t}N (0\leq t\leq 1)$, $Eg=Eg2[t]=3.42(1-t)+6.2t-1.057t(1-t);$

For $In_sAl_tGa_{1-s-t}N (0\leq s\leq 1,\ 0\leq t\leq 1)$, $Eg=\{s\ Eg1[s+t]+t3.42Eg2[s+t]\}/(s+t).$ [Formula 4]

Thus, a refractive index can be obtained according to Formula 5.

$p[\lambda]=1/[1/\lambda-(Eg-3.42)/1239.852]$

When $p[\lambda]>360.7$, then $n\ (p[\lambda])=[4.3663801+p^2/(p^2-295.9^2)]^0.5.$ When $p[\lambda]\leq 360.7$, then $n(p[\lambda])=c0+c1\ q+c2\ q^2+c3\ q^3+c4\ q^4$ [Formula 5]

$q=p\ [\lambda]-360$
$c0=2.718$
$c1=9.976e-3$
$c2=3.005e-4$
$c3=4.584e-6$
$c4=2.596e-8$ In the present specification, a "radiation loss" is defined as a value calculated by a finite difference beam propagation method (FD-BPM) in the laser structure prepared. Reference can be made to, for example, "IEEE J. Quantum Electron, 29 (1993), 2639," by W. P. Huang. First, a proper light intensity distribution (with single peaks when obtaining the basic mode or with two peaks when obtaining the 1st-order mode) that serves as an initial value enters the laser structure prepared. After propagation for 300 µm, a light intensity distribution is calculated according to FD-BPM. The result shows that lateral mode components in this calculation structure are selectively propagated, and other components are propagated outside the calculation structure and reduced to a negligible intensity during the 300 µm propagation. It is thus possible to consider a light intensity distribution after the propagation as a lateral-mode light intensity distribution in the calculation structure. Next, the obtained lateral-mode light intensity distribution enters the same calculation structure. Then, a radiation loss in the calculation structure is obtained according to a power attenuation rate after propagation for a unit length. The region for the calculation structure is determined as follows. A refractive index distribution is obtained in a section perpendicular to the resonator direction in the laser structure, according to a layer thickness obtained with a scanning electron microscope (SEM), and an indium (In) content and an aluminum (Al) content obtained with an X ray. Within this refractive index distribution, the region for the calculation structure is only that of ±4 µm in the perpendicular and horizontal directions from the origin that is the intersection point of the center surface of the active layer, the center surface of the ridge, and a section perpendicular to the resonator direction. Light radiated outside this calculation structure is taken as a radiation loss. As for the surroundings of the calculation structure, a transparent boundary condition is used. Reference can be made to, for example, "Optics Lett., 16 (1991), 624," by G. R. Hadley. Cell size at the time of differentiation is set at 0.04 µm or less in length and 0.1 µm or less in width, which size is constant throughout the calculation structure.

The device to optically record and reproduce data according to the present invention comprises at least one semiconductor laser element according to the present invention as a light source of the recording light for recording data or as a light source for reproducing data. As long as the semiconductor laser element of the present invention is used as a light source of the recording light or as a light source of the reproducing light, any prior art structures can be used.

The optical data recording device according to the present invention may comprise a semiconductor laser element of the present invention, recording light radiating control means for allowing radiation of a laser beam for recording from the semiconductor laser element in accordance with an electrical signal, light focusing means for focusing a laser beam radiated from the semiconductor laser element, and irradiating position control means for recording data by irradiating a particular position of a light recording medium with a laser beam collected by the light collecting means. Such construction is also referred to as an optical-recording-only device. The semiconductor laser element used has such FFP that ellipticity is close to 1, in addition to having oscillations in the basic horizontal-lateral mode until output power reaches a high level. The use of such semiconductor laser element provides a choice of not employing a conventionally essential molded prism as means for making the beam spot of the ellipticity close to 1.

The optical data recording device according to the present invention may comprise a reproduction-only light source for radiating light for reproduction, reproduction light radiating control means for allowing radiation of light from the reproduction-only light source in accordance with a reproduction command signal, reproduction-only light focusing means for focusing light radiated from the reproduction-only light source, reproduction light irradiating position control means for irradiating a particular position of a light recording medium with light collected by the light collecting means, light detecting means for detecting light reflected by or transmitting through the light recording medium, and light electrical conversion means for reproducing data recorded in the light recording medium by converting an optical signal detected by the light detecting means into an electrical signal. This construction enables reproduction of recorded data as well as data recording. Such construction is also referred to as an optical data recording/reproducing device.

The optical data recording/reproducing device according to the present invention may comprise one semiconductor laser element of the present invention serving as a light source for recording and as a light source for reproduction, or may comprise two different semiconductor laser elements of the present invention, one serving as a light source for recording and the other as a light source for reproduction. When one semiconductor laser element serves both as a light source for recording and a light source for reproduction, radiation intensity needs to be varied. In any other means, the semiconductor laser element may serve as a light source both for recording and reproduction, thus seeking a simple structure.

The optical data recording device and optical data reproducing device according to the present invention may comprise an erasing-only light source for radiating light for erasing, erasing light radiating control means for allowing radiation of light for erasing from the erasing-only light source in accordance with an erasing command signal, erasing-only light focusing means for focusing light radiated from the erasing-only light source, and erasing light irradiating position control means for erasing recorded data by irradiating a particular position of a light recording medium with light collected by the light collecting means. Such construction is also referred to as an erasable-type optical data recording device or an erasable-type optical data reproducing device.

The erasable-type optical data recording device according to the present invention may comprise one semiconductor laser element of the present invention serving as a light source for recording and as a light source for reproduction, or may comprise two different semiconductor laser elements of the present invention, one serving as a light source for recording and the other as a light source for reproduction. The erasable-type optical data recording/reproducing device according to the present invention may comprise one semiconductor laser element of the present invention serving as a light source for recording and as a light source for reproduction, or may comprise two or three different semiconductor laser elements of the present invention. In any other means, the semiconductor laser element may assume two or more functions including a light source for recording, a light source for reproduction, and a light-source for erasing, thus seeking a simple structure.

The optical reproducing device according to the present invention may comprise a semiconductor element of the present invention for radiating light for reproduction, reproduction light radiating control means for allowing radiation of light from a reproduction-only light source, reproduction-only light focusing means for focusing light radiated from the reproduction-only light source, reproduction light irradiating position control means for irradiating a particular position of a light recording medium with light collected by the light collecting means, light detecting means for detecting light reflected by or transmitting through the light recording medium, and light electrical conversion means for reproducing data recorded in the light recording medium by converting an optical signal detected by the light detecting means into an electrical signal. Such construction is also referred to as an optical-reproduction-only device.

The semiconductor laser element according to the present invention may be used as a light source of optical data transfer devices wherein optical signals are radiated to the media that optically transfer data such as optical fibers. Examples of such optical data transfer devices include devices to convert data provided in the form of an electrical signal into an optical signal and radiate it to the media, and intermediate devices for optical signals.

Embodiment 1

The semiconductor laser element according to the present embodiment is a nitride semiconductor laser element having a ridge-stripe structure. Since the structure of the nitride semiconductor laser element is the same as that of the semiconductor laser element shown in FIG. 1, the following description will refer to FIG. 1.

This semiconductor laser element has a substrate 101 made of n-type GaN (preferably 30–500 µm thick), a base layer 102 made of n-type GaN (preferably 0.1–10 µm thick), a lower clad layer 103 (preferably 0.8 µm or more in thickness) made of n-type $Al_x Ga_{1-x} N$ (preferably $0.04 \leq x \leq 0.15$), a lower light waveguide layer 104 (preferably 0–0.15 µm thick) made of n-type GaN, an active layer 105 (preferably 5–100 nm thick in total) having a multiple quantum well structure composed of an alternate deposition of a quantum well layer made of $In_w Ga_{1-w} N$ (preferably $0 \leq w \leq 0.2$) and a barrier layer made of n-type $In_v Ga_{1-v} N$ ($0 \leq v < w$), a carrier block layer 106 (preferably 0–0.1 µm thick) made of p-type $Al_z Ga_{1-z} N$, an upper light waveguide layer 107 (preferably 0.05–0.15 µm thick at a center portion) made of p-type GaN and having a protruding center portion that protrudes upward beyond other portions of the upper light waveguide layer 107, an upper clad layer 108 (preferably 0.4 µm or more in thickness) made of p-type $Al_y Ga_{1-y} N$ (preferably $0.04 \leq y > 0.15$) and formed on the protruding portion of the upper light waveguide layer, a contact layer 109 (preferably 0.01–10 µm thick) made of p-type GaN and formed on the upper clad layer, buried layers 110 provided on either sides of a ridge-stripe structure (1–2 µm width) composed of the protruding portion of the upper light waveguide layer, the upper clad layer, and the contact layer, a positive electrode 112, and a negative electrode 111.

The wavelength of light emitted from this nitride semiconductor laser element is in the range from 370 nm to 430 nm, and adjusted by an In Ga N content of the semiconductors composing the quantum well layer and the barrier layer of the active layer 105 and by the thickness of the respective layers.

The preferable number of the layers of the quantum well layer in the active layer 105 is from two to six, and particularly preferably two or three. Although the semiconductors used here for the quantum well layer are non-doped, n-type semiconductors containing, for example, Si may be employed. Although the semiconductor used here for the barrier layer is an n-type semiconductor, a non-doped semiconductor may be employed.

The semiconductor layers used here for the lower light waveguide layer 104, the upper light waveguide layer 107, and the carrier block layer 106 are those semiconductors whose types of conductivity are specified by inclusion of conductive type impurities However, non-doped semiconductors may be employed for the layers.

Examples of the p-type-oriented electrode 112 (positive electrode) include an Au/Ni electrode composed of a nickel (Ni) film and a gold (Au) film deposited in this order, and an Au/Pd electrode composed of a palladium (Pd) film and a gold (Au) film deposited in this order. Examples of the n-type-oriented electrode 111 (negative electrode) include an Al/Ti electrode composed of a titanium (Ti) film and an aluminum (Al) film deposited in this order, and an Au/W electrode composed of a tungsten (W) film and a gold (Au) film deposited in this order.

Next, the fabrication method of the nitride semiconductor laser element according to the present embodiment will be described.

First, the substrate 101 made of n-type GaN with the (0001) C surface dedicated for crystal growth was washed [washing step]. The washed GaN substrate 101 was put into an MOCVD device and subjected to cleaning in a high temperature of approximately 1100° C. and in an atmosphere of $H_2$ [cleaning step].

Next, the temperature was decreased to approximately 1050° C. By introduction of TMG (trimethylgallium) at 100 µmol/min and $SiH_4$ (monosilane) at 10 nmol/min, an n-type GaN layer was grown as the base layer 102 [base layer forming step].

After the base layer forming step, the flow rate of TMG was adjusted to 50 µmol/min, and TMA (trimethylaluminum) was introduced at a constant rate. With the flowing of $SiH_4$ at 10 nmol/min, an n-type $Al_x Ga_{1-x} N$ layer (x=0.06, for example) was grown as the lower clad layer 103 [lower clad layer forming step].

After the lower clad layer forming step, the supply of TMA was terminated, and the flow rate of TMG was adjusted to 100 µmol/min. Thus, an n-type GaN layer was grown as the lower light waveguide layer 104 [lower light waveguide layer forming step].

After the lower light waveguide layer forming step, the supply of TMG was terminated, and the carrier gas was changed from a hydrogen gas ($H_2$ gas) to a nitrogen gas ($N_2$ gas). The temperature was decreased to 700° C., and a constant rate of trimethylindium (TMI), which is an indium material, and TMG at 15 µmol/min were introduced. Thus, an n-type $In_v Ga_{1-v} N$ layer (v=0.005, for example) was grown as a barrier layer composing the active layer 105 [barrier layer forming step]. Next, the supply of $SiH_4$ was terminated and that of TMI was increased to a certain rate, thus growing an $In_w Ga_{1-w} N$ layer (v=0.09, for example) as the quantum well layer of the active layer 105 [quantum well layer forming step]. The flow rate of TMI introduced at the time of growth was adjusted so that the In composition of the film obtained would correspond to the amount of TMI introduced. The barrier layer forming step and the quantum well layer forming step were repeated to form the active layer 105 having the desired multiple quantum well structure [active layer forming step].

After the active layer forming step, the supply of TMI, TMG, and $SiH_4$ was terminated, and the temperature was increased to 1050° C. The carrier gas was changed from an $N_2$ gas to an $H_2$ gas, followed by an introduction of TMG at 50 µmol/min, an appropriate amount of TMA, and a 10 nmol/min of bis(cyclopentadienyl)magnesium ($Cp_2Mg$), which was a material of p-type impurities. Thus, a p-type $Al_z Ga_{1-z} N$ layer (z=0.3, for example) was grown as the carrier block layer 106 [carrier block layer forming step].

After the carrier block layer forming step, the supply of TMA was terminated, and that of TMG was adjusted to 100 µmol/min. Thus, a p-type GaN layer was grown as the upper light waveguide layer 107 [upper light waveguide layer forming step].

After the upper light waveguide layer forming step, the supply of TMG was adjusted to 50 μmol/min, and a constant rate of TMA was introduced. Thus, a p-type $Al_y Ga_{1-y} N$ layer (y=0.06, for example) was grown as the upper clad layer 108 [upper clad layer forming step].

After the upper clad layer forming step, the supply of TMG was adjusted to 100 μmol/min, and that of TMA was terminated. Thus, a p-type GaN layer was grown as the contact layer 109 [contact layer forming step].

After the contact layer forming step, the supply of TMG and $Cp_2Mg$ was terminated, and the temperature was decreased to a room temperature. The substrate having formed thereon the various semiconductor layers was put out of the MOCVD device. Then, using photolithography and reactive ion etching techniques, a ridge-stripe structure with a predetermined stripe width was formed in the center region. Specifically, the semiconductor layers deposited under the side regions of the center region were etched to a predetermined depth [ridge-stripe structure forming step]. In this etching, the side regions of the contact layer 109 and the upper clad layer 108 were completely removed, and those of the upper light waveguide layer 107 were left with an appropriate thickness. The specific value of the appropriate thickness (residual thickness after etching) was determined according to the setting of the refractive index of the lower clad layer 103 so that the refractive index would come between an effective index against the basic horizontal-lateral mode and an effective index against the 1st-order horizontal-lateral mode.

After the ridge-stripe structure forming step, buried films to compose the buried layers 110 were formed. Then, using a photography technique, the top of the contact layer 109 was exposed [buried layer forming step].

After the buried layer forming step, the p-type-oriented electrode (positive electrode) 112 was formed on the approximately entire surface of the contact layer 109 [second-conductivity-type-oriented electrode forming step]. On the approximately entire bottom (the other side) of the substrate 101, the n-type-oriented electrode (negative electrode) 111 was formed [first-conductivity-type-oriented electrode forming step]. The n-type-oriented electrode forming step may be prior to the p-type-oriented electrode forming step or may be conducted before the base layer forming step.

After the second-conductivity-type-oriented electrode forming step and the first-conductivity-type-oriented electrode forming step, the substrate having formed thereon the semiconductor layers was cleaved to form two resonator facets (not shown) to serve as resonator mirrors [resonator facet forming step].

Finally, the surface of one of the two resonator facets not for radiating laser beams was subjected to a reflective coating of as high as approximately 95%, thus forming a highly reflective film, which is not shown [highly reflective film forming step]. Through the steps above, the nitride semiconductor laser element shown in FIG. 1 was completed.

The nitride semiconductor laser element according to Embodiment 1 covers all the features described in the first, second, and third aspects of the present invention, thus satisfactorily realizing the objects of the present invention. Further, the refractive index of the substrate is equal to or more than an effective index against the basic horizontal-lateral mode. Such condition is satisfied in this nitride semiconductor laser element.

Embodiment 2

Figure 5:
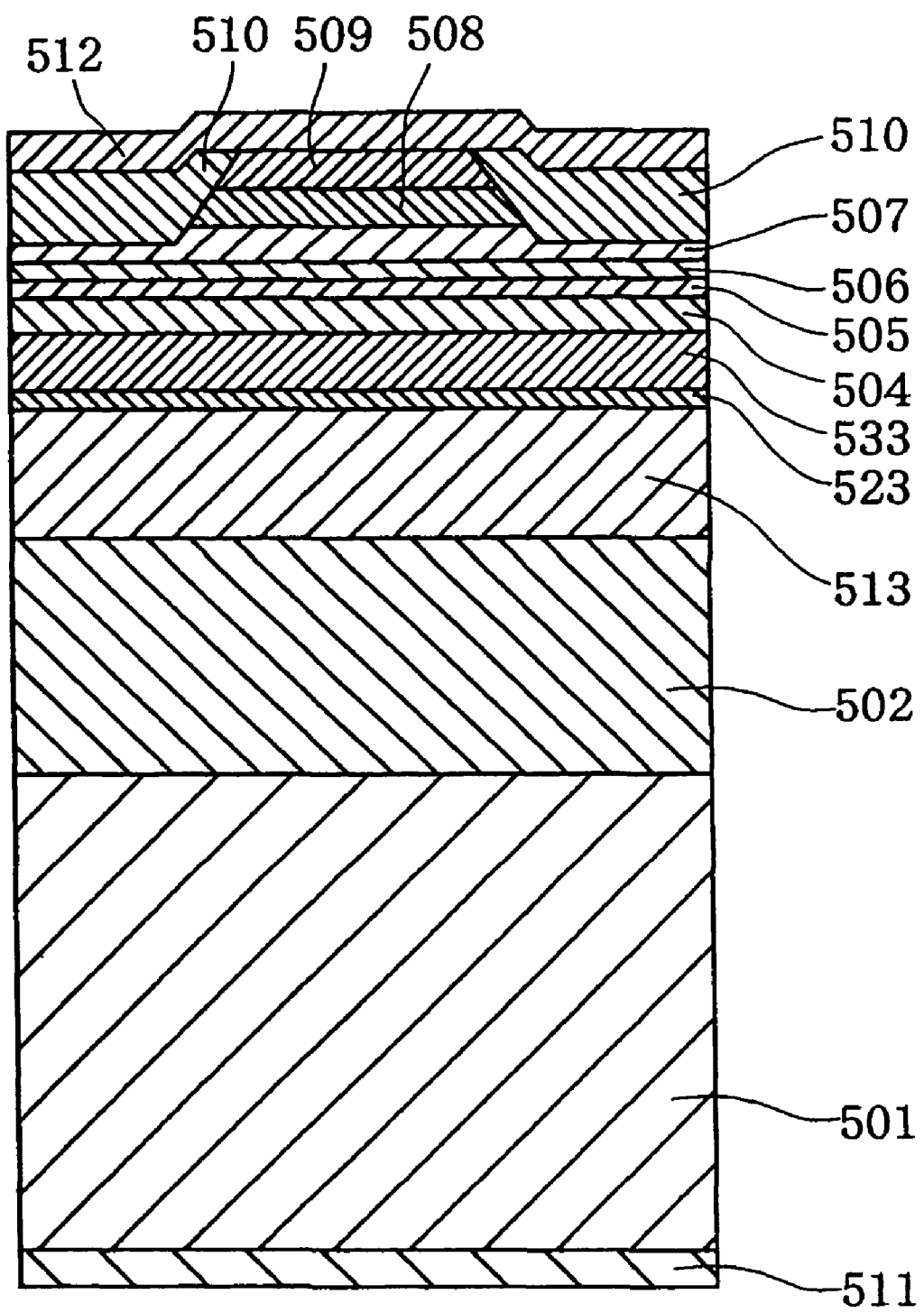
FIG. 5 is a schematic sectional view of a nitride semiconductor laser element showing another example of the structure thereof.

FIG. 5 is a schematic sectional view of a nitride semiconductor laser element showing an example of the structure thereof according to Embodiment 2 of the present invention. The section is perpendicular to the direction of the resonator of the waveguide portion of the semiconductor laser element. This nitride semiconductor laser element is of the same structure as that of the nitride semiconductor laser element of Embodiment 1 except that the lower clad layer has a three-layer structure composed of a first lower clad layer, a second lower clad layer, and a third lower clad layer, deposited in this order starting from the substrate side.

This nitride semiconductor laser element according to the present embodiment has a substrate 501 made of n-type GaN (preferably 30–500 μm thick), a base layer 502 made of n-type GaN (preferably 0.1–10 μm thick), a first lower clad layer 513 (preferably 0.8 μm or more in thickness) made of n-type $Al_{x1} Ga_{1-x1} N$ (0.04≦x1<x2≦0.15), a second lower clad layer 523 (from 0.05 to 0.3 μm in thickness) made of n-type $Al_{x2} Ga_{1-x2} N$ (0.04≦x1<x2≦0.15), a third lower clad layer 533 (preferably 0.01–0.3 μm in thickness) made of n-type $Al_{x3} Ga_{1-x3} N$ (0.04≦x3<x2≦0.15), a lower light waveguide layer 504 (preferably 0–0.15 μm thick) made of n-type GaN, an active layer 505 (preferably 5–100 nm thick in total) having a multiple quantum well structure composed of an alternate deposition of a quantum well layer made of $In_w Ga_{1-w} N$ (0<w≦0.2) and a barrier layer made of n-type $In_v Ga_{1-v} N$ (0≦v<w), a carrier block layer 506 (preferably 0–0.1 μm thick) made of p-type $Al_z Ga_{1-z} N$, an upper light waveguide layer 507 (preferably 0.05–0.15 μm thick at a center portion) made of p-type GaN and having a stripe-shaped protruding center portion that protrudes upward beyond other portions of the upper light waveguide layer 507, an upper clad layer 508 (preferably 0.4 μm or more in thickness) made of p-type $Al_y Ga_{1-y} N$ (preferably 0.04≦y≦0.15) and formed on the protruding portion of the upper light waveguide layer 507, a contact layer 509 (preferably 0.01–10 μm thick) made of p-type GaN and formed on the upper clad layer 508, buried layers 510 provided on either sides of a ridge-stripe structure composed of the protruding portion of the upper light waveguide layer 507, the upper clad layer 508, and the contact layer 509, a positive electrode 512, and a negative electrode 511.

In this nitride semiconductor laser element, the semiconductor of the second lower clad layer 523 has a higher Al content than the first lower clad layer 513 and the third lower clad layer 533. That is, the refractive index of the second lower clad layer 523 is lower than the refractive indexes of the first lower clad layer 513 and the third lower clad layer 533. The second lower clad layer 523 is formed at a distance of 0.01 to 0.03 μm from the upper light waveguide layer 507.

The effects and operations of the nitride semiconductor laser element according to Embodiment 2 will be described. Note that the structure described in Embodiment 1 has similar effects and operations to Embodiment 2, with a negligible level of variation.

Figure 2:
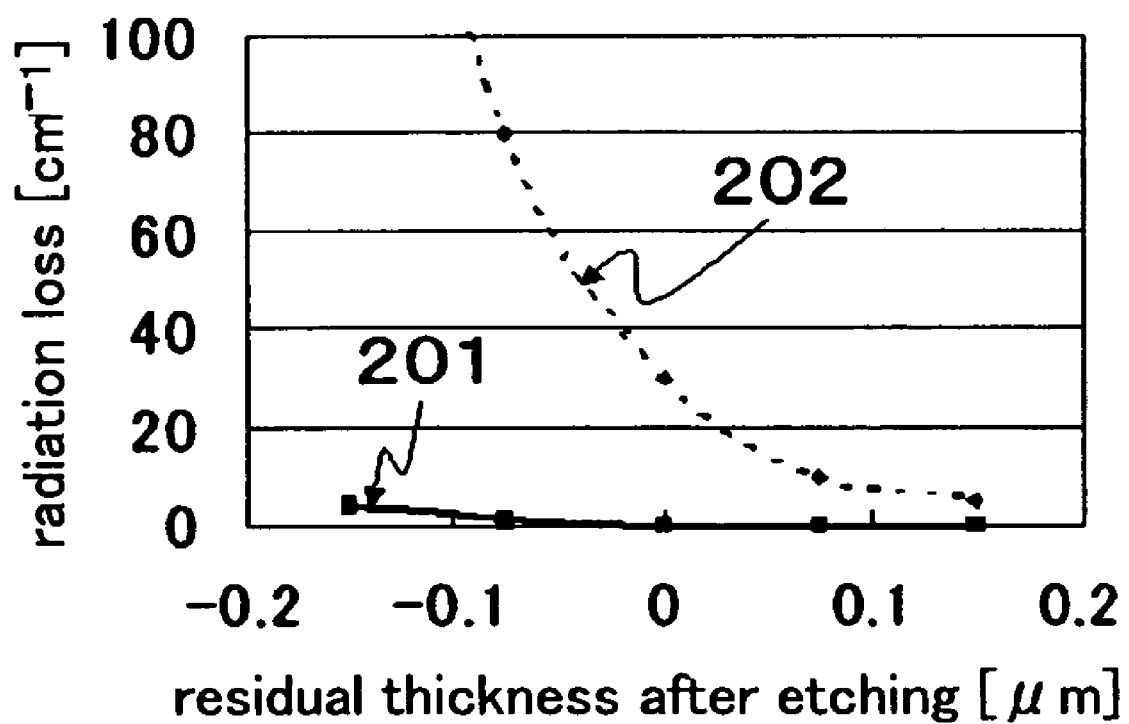
FIG. 2 is a plotted graph of the residual thickness after etching and a radiation loss due to percolation through the substrate side both in the basic horizontal-lateral mode and the 1st-order horizontal-lateral mode.

FIG. 2 is a plotted graph of the residual thickness after etching and a radiation loss due to percolation through the substrate 501 side (lower clad layer side) both in the basic horizontal-lateral mode and the 1st-order horizontal-lateral mode. The curved lines 201 and 202 are characteristic curved lines respectively corresponding to the basic horizontal-lateral mode and the 1st-order horizontal-lateral mode. The residual thickness after etching used herein is defined as a distance between the top of the carrier block layer and the bottom surface exposed as a result of the etching conducted after forming the ridge-stripe structure for confining light in the horizontal direction.

As shown in FIG. 2, it was found that if the residual thickness after etching was thinner than the center portion (the inside of the striped region) of the upper light waveguide layer 507, then a radiation loss due to percolation through the lower clad layer side (lower clad layer side) in the 1st-order horizontal-lateral mode tended to show a drastic increase, forming a hyperbola approaching an asymptote parallel to the longitudinal axis.

Figure 3:
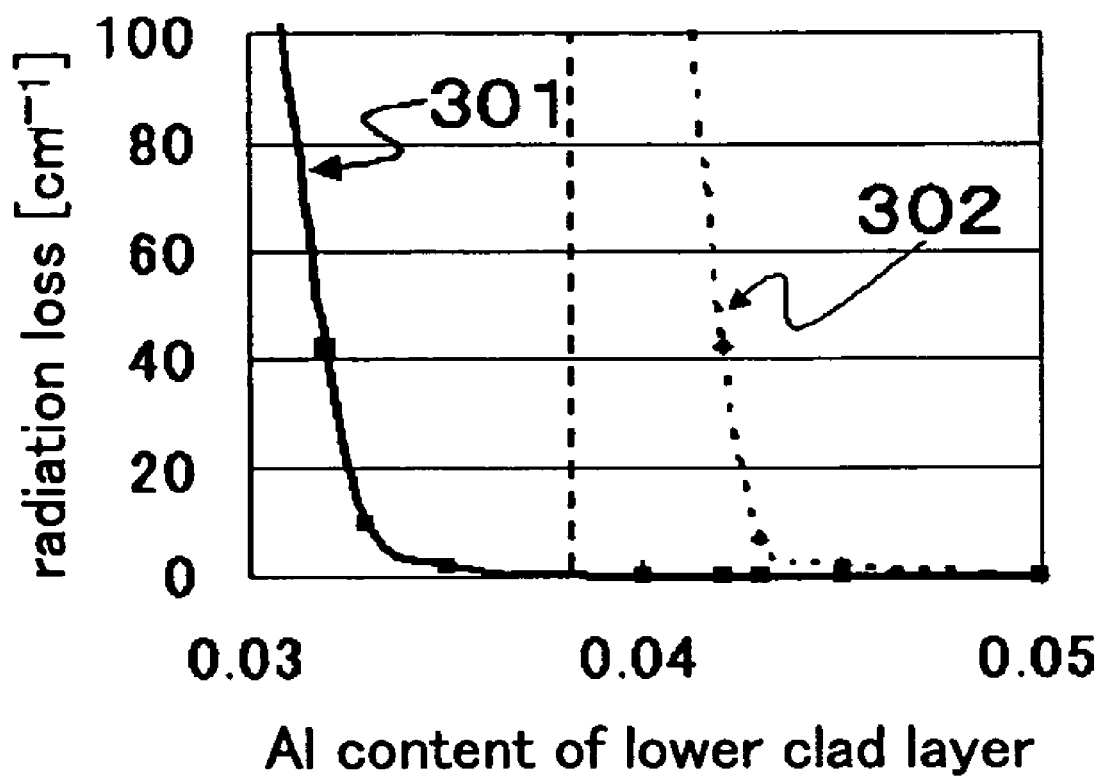
FIG. 3 is a plotted graph of an Al content of the lower clad layer and a radiation loss due to percolation through the lower clad layer side both in the basic horizontal-lateral mode and the 1st-order horizontal-lateral mode.

FIG. 3 is a plotted graph of an Al content of the lower clad layer and a radiation loss due to percolation through the lower clad layer side both in the basic horizontal-lateral mode and the 1st-order horizontal-lateral mode. The curved lines 301 and 302 are characteristic curved lines respectively corresponding to the basic horizontal-lateral mode and the 1st-order horizontal-lateral mode.

As shown in FIG. 3, it was found that if an Al content in the lower clad layer decreased to some extent, then a radiation loss due to percolation through the lower clad layer side in the 1st-order horizontal-lateral mode tended to show a drastic increase, forming a hyperbola approaching an asymptote parallel to the longitudinal axis.

The following discusses the cause of such tendencies shown in FIGS. 2 and 3.

Figure 6:
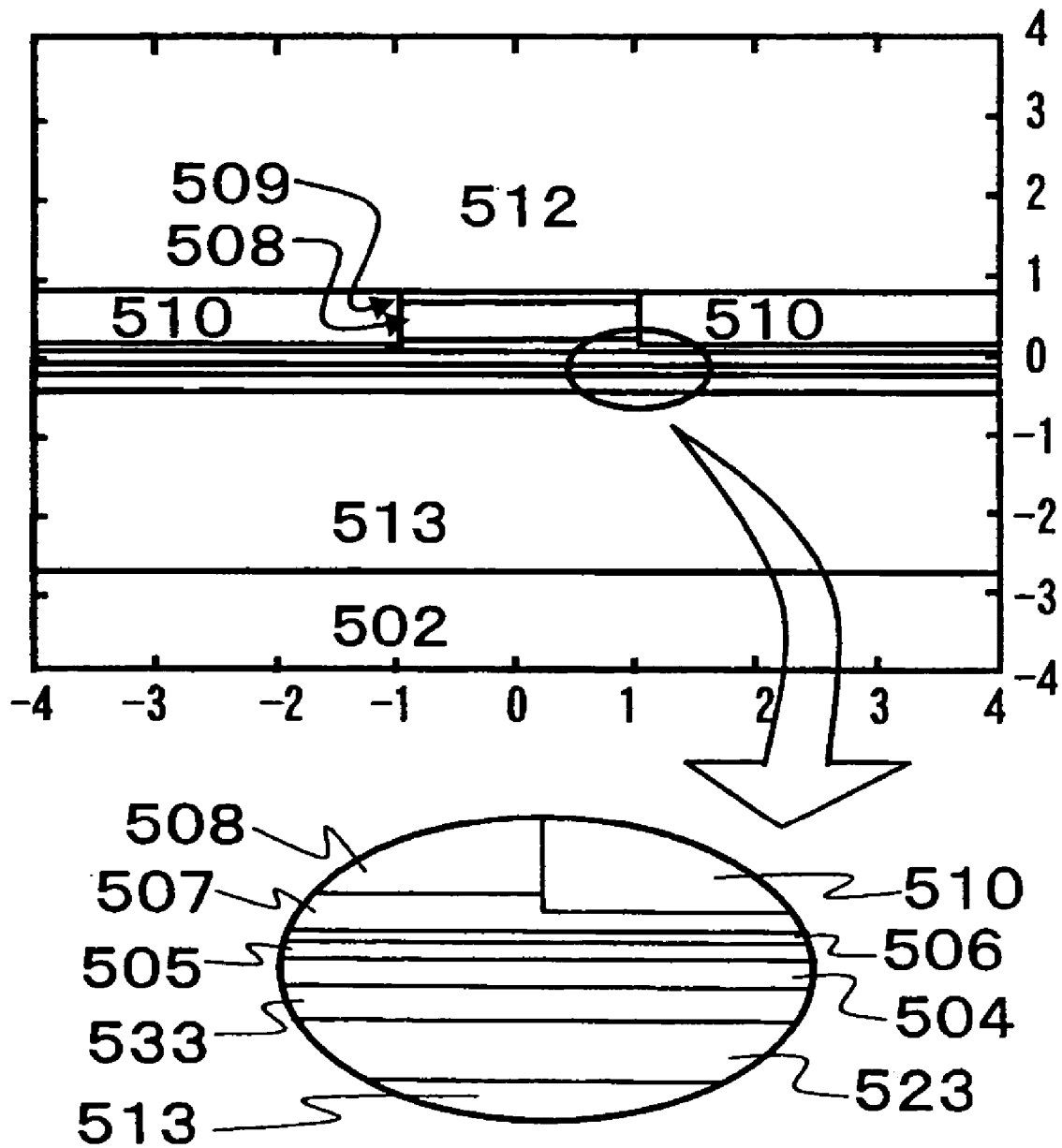
FIG. 6 is a sectional view of a nitride semiconductor laser element in Embodiment 2 showing a calculating configuration to obtain the distribution of light intensity in the lateral mode.
Figure 7:
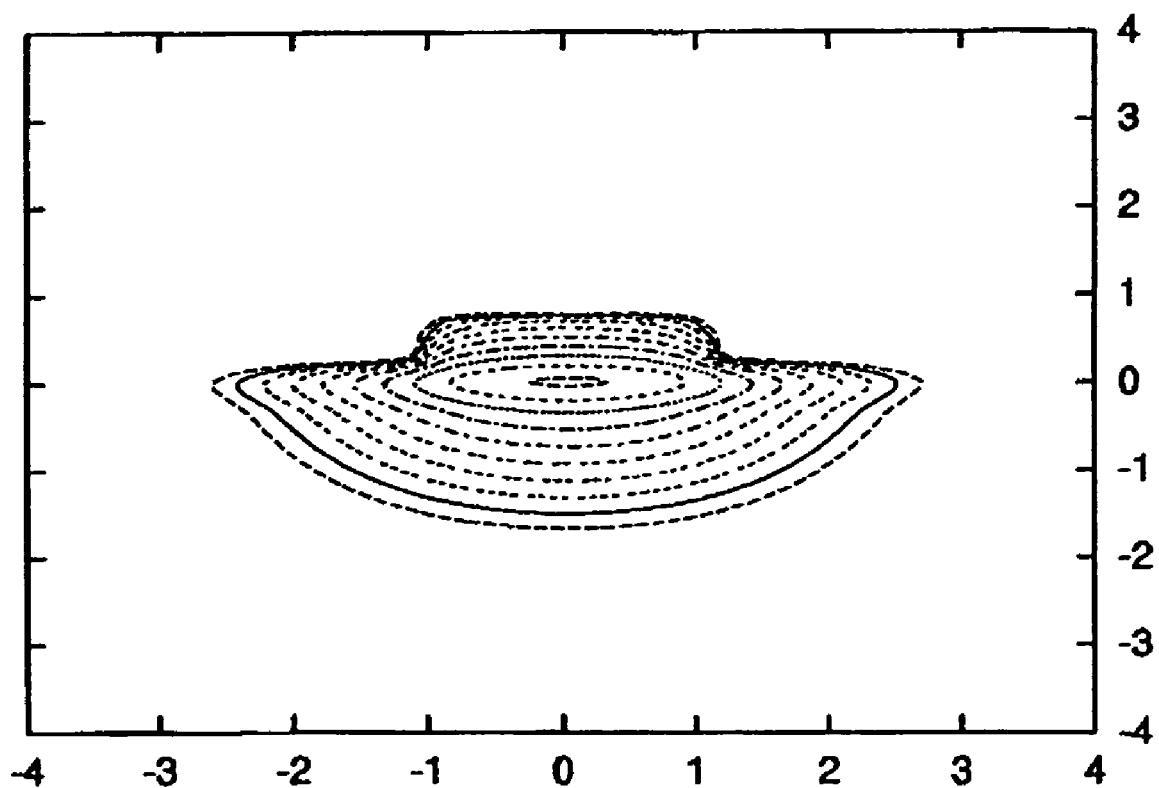
FIG. 7 is a graph showing the result of the calculation of a light intensity distribution in the basic horizontal-lateral mode.
Figure 8:
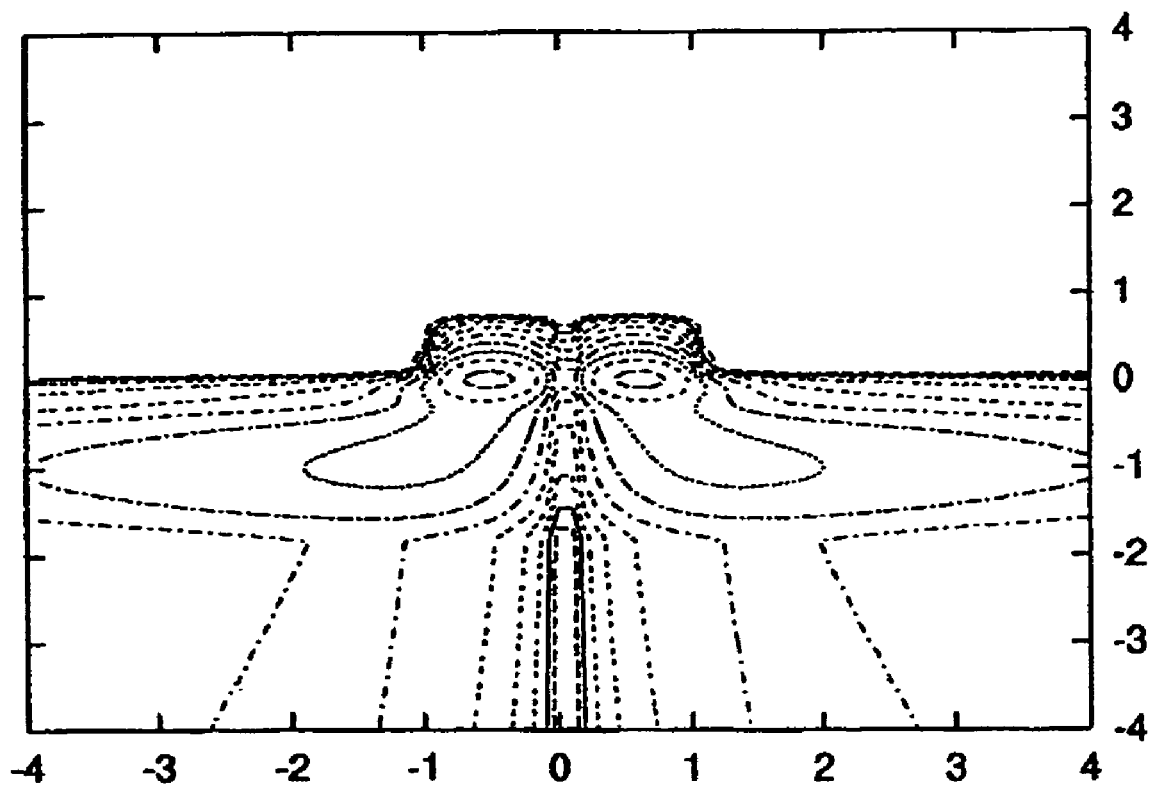
FIG. 8 is a graph showing the result of the calculation of a light intensity distribution in the basic horizontal-lateral mode.

FIG. 6 shows simplified boundaries of different refractive indexes based on FIG. 5, which shows a schematic sectional view of the nitride semiconductor laser element of Embodiment 2. FIGS. 7 and 8 show, in the nitride semiconductor laser element of Embodiment 2, the light intensity distribution of the basic horizontal-lateral mode and the 1st-order horizontal-lateral mode in the form of contour lines. Light intensity is expressed in logarithmic values and in a section perpendicular to the resonator direction. FIGS. 7 and 8 show calculated values of the light intensity distributions in the lateral mode within the refractive index distribution shown in FIG. 6.

The calculation method employed to obtain the results shown in FIGS. 7 and 8 is a finite difference beam propagation method (FD-BPM). First, a proper light intensity distribution that serves as an initial value enters the structure of FIG. 6. After propagation for a few micrometers (300 μm in this specification), a light intensity distribution is calculated according to FD-BPM. The result shows that horizontal-lateral mode components in this calculation structure of FIG. 6 are selectively propagated, and other components are propagated outside the calculation structure and reduced to a negligible intensity during the few micrometers propagation. As an initial value, the use of a light intensity distribution close to that of the basic horizontal-lateral mode or the 1st-order horizontal-lateral mode in the calculation structure of FIG. 6 provides a light intensity distribution in the desired horizontal-lateral mode, that is, the basic horizontal-lateral mode or the 1st-order horizontal-lateral mode. By this method, the light intensity distributions shown in FIGS. 7 and 8 were obtained.

From the light intensity distribution of the basic horizontal-lateral mode shown in FIG. 7, it has been found that the peak of the light intensity distribution lies in the active layer and in the vicinity thereof shown in FIG. 6, and light intensity decreases exponentially with a distance away from the active layer. That is, it has been found that light generated in the basic horizontal-lateral mode is confined in the laser element structure. On the contrary, from the light intensity distribution of the 1st-order horizontal-lateral mode shown in FIG. 8, it has been found that light generated in the 1st-order horizontal-lateral mode is radiated from the active layer 505 toward the base layer 502. That is, in the nitride semiconductor laser element of Embodiment 2, the 1st-order horizontal-lateral mode is conspicuous in light radiation toward the base layer 502, made of n-type GaN, as compared with the basic horizontal-lateral mode.

Figure 4:
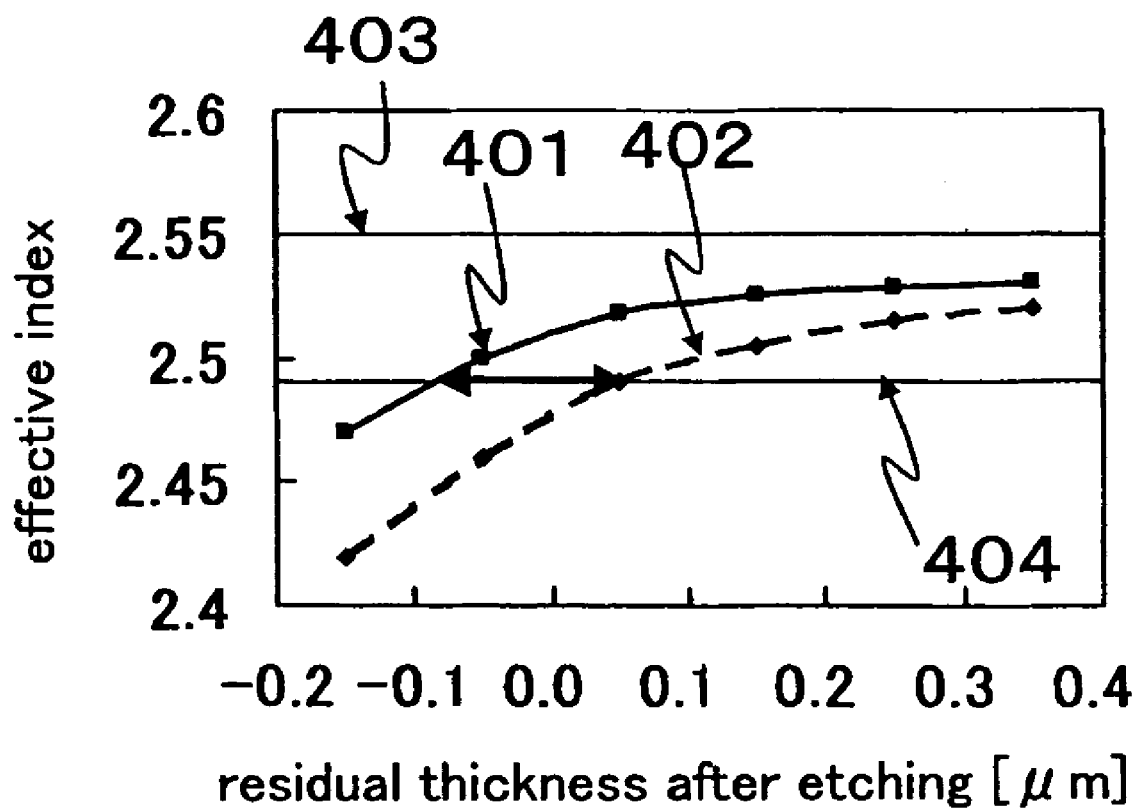
FIG. 4 is a plotted graph of a change in an effective index against the basic horizontal-lateral mode and in an effective index against the 1st-order horizontal-lateral mode in accordance with the residual thickness after etching.

FIG. 4 is a plotted graph of a change in an effective index against the basic horizontal-lateral mode and in an effective index against the 1st-order horizontal-lateral mode in accordance with the residual thickness after etching. The curved lines 401 and 402 are characteristic curved lines respectively corresponding to the basic horizontal-lateral mode and the 1st-order horizontal-lateral mode. The solid line 403 in FIG. 4 is a plotted straight line of the average (weighted average weighted by the layer thickness) of the refractive indexes throughout the thicknesses of the upper light waveguide layer and the lower light waveguide layer. The solid line 404 in FIG. 4 is a plotted straight line of the average (weighted average weighted by the layer thickness) of the refractive indexes throughout the thicknesses of the lower clad layer. Both of the averages are expressed in effective index values.

The values used for the effective index of each mode are those obtained from a horizontal-lateral mode calculation. For conventional AlGaAs semiconductor laser elements, a local effective index $N_{out}$ outside the striped region used for the horizontal-lateral mode calculation can be obtained with a common calculation of an electric field distribution, just as when obtaining a local effective index $N_{in}$ inside the striped region. The calculation of electric field distribution assumes that there is an imaginary slab waveguide that has a refractive index distribution in the direction perpendicular to the inside of the stripe and that has the same refractive index distribution in the horizontal direction as that in the perpendicular direction. This method can be applied to conventional nitride semiconductor laser elements, as long as the residual thickness after etching is set thicker than the upper light waveguide layer.

However, in the nitride semiconductor laser element of the present invention, when the residual thickness after etching is set thinner than the upper light waveguide layer (when completely removing the upper clad layer outside the striped region by etching), then a refractive index distribution in the perpendicular direction becomes conspicuously asymmetrical between top and bottom. This results in absence of a waveguiding mode and fails to obtain $N_{out}$ with the common calculation of an electric field distribution, which assumes an imaginary slab waveguide, which calculation is conducted relative to the light-confining region (corresponding to, in this example, the region from the top of the upper light waveguide layer down to the bottom of the lower light wave guide layer). In the case of semiconductor laser elements wherein the upper clad layer outside the striped region is completely etched away, a local effective index $N_{out}$ outside the striped region is a value obtained from the following general formula 6, where the integral range of the integral symbol is $-\infty < x < +\infty$.

$$N_{out}{}^2 = N_{in}{}^2 + \int \{n_{out}(x)^2 - n_{in}(x)^2\} \cdot P(x) \cdot dx \quad \text{[formula 6]}$$

In this formula, the perpendicular direction of the semiconductor laser element is taken to be the x axis. $N_{in}$ refers to a local effective index inside the striped region, $n_{in}(x)$ to a refractive index inside the striped region in the perpendicular direction, $n_{out}(x)$ to a refractive index outside the striped region in the perpendicular direction, and $P(x)$ to an electric field distribution in the perpendicular direction that is standardized to meet the following Formula 7 obtained when calculating a local effective index inside the striped region. In Formula 7, the integral range of the integral symbol is $-\infty < x < +\infty$.

$$\int P(x)dx = 1 \quad \text{[formula 7]}$$

When this method is used for conventional nitride semiconductor laser elements, an effective index against a horizontal-lateral mode and its light intensity distribution obtained from the above calculation are about the same as the results obtained from conventional methods.

The basic and 1st-order horizontal-lateral modes are guided through the upper light waveguide layer and the lower upper light waveguide layer, and therefore effective index 401 against the basic horizontal-lateral mode and effective index 402 against the 1st-order horizontal-lateral mode are in no case above the straight line 403.

With a decrease in the residual thickness after etching, the distance between the buried layers, which are layers with a low refractive index, and the laser-beam-confining region decreases. This makes an effective index against a mode susceptible to a refractive index distribution outside the striped region, and decreases the effective index. When the effective index is below the refractive index of the lower clad layer, light is no longer confined in the perpendicular direction, showing conspicuous radiation toward the lower clad layer. An effective index against the 1st-order horizontal-lateral mode is always smaller than one against the basic horizontal-lateral mode. This realizes the situation in which with a decrease in the residual thickness after etching, only an effective index against the 1st-order horizontal-lateral mode is below the refractive index of the lower clad layer, while an effective index against the basic horizontal-lateral mode is above the refractive index of the lower clad layer. Under such situation, selective radiation is realized. Specifically, a radiation loss due to percolation through the n-type clad layer increases in the 1st-order lateral mode and keeps at a low level in the basic lateral mode.

The tolerance of the residual thickness after etching in realizing such selective radiation becomes wider as the refractive index of the lower clad layer is made closer to the refractive indexes of the upper light waveguide layer and the lower light waveguide layer, that is, as the content of Al in AlGaN, which is material composing the lower clad layer, is made smaller.

However, if the refractive index of the lower clad layer excessively increases, a radiation loss toward the lower clad layer in the basic horizontal-lateral mode accordingly increases excessively, failing to realize satisfactory selective radiation. Also, if a difference between the refractive index of the lower clad layer and the refractive indexes of the upper light waveguide layer and the lower light waveguide layer narrows excessively, then perpendicularly-directed confinement of light in the basic horizontal-lateral mode weakens excessively, failing to realize satisfactory selective radiation. Therefore, setting within the optimum range is desirable.

Figure 18:
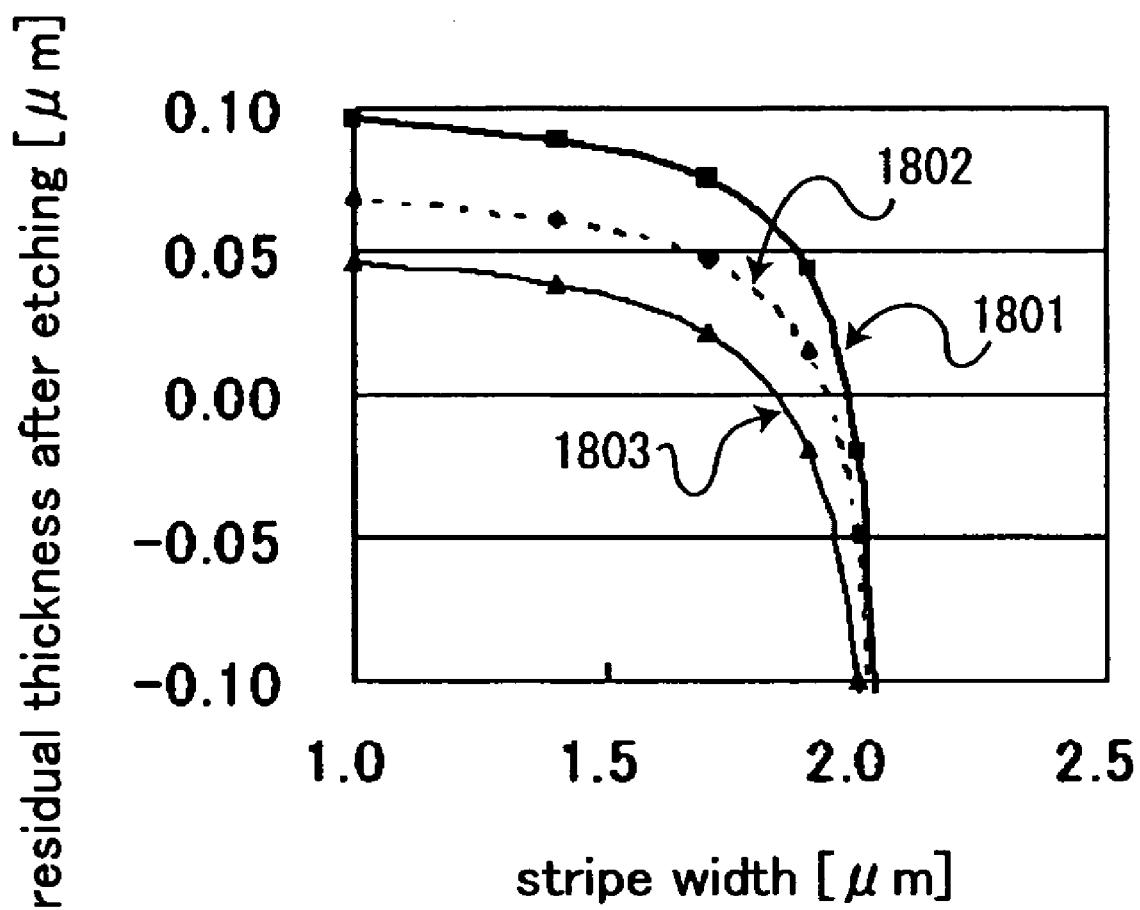
FIG. 18 is a plotted graph of a radiation loss in the 1st-order horizontal-lateral mode in accordance with a change in the stripe width shown in the horizontal axis and in the residual thickness after etching shown in the vertical axis, in a semiconductor laser element of the present invention.

FIG. 18 is a plotted graph of a radiation loss in the 1st-order horizontal-lateral mode in accordance with a change in stripe width shown in the horizontal axis and in the residual thickness after etching shown in the vertical axis, in a semiconductor laser element of the present embodiment. The curved lines 1801, 1802, and 1803 respectively denote the points where a radiation loss in the 1st-order horizontal-lateral mode is 10 cm$^{-1}$, 50 cm$^{-1}$, and 100 cm$^{-1}$. FIG. 18 shows that as the residual thickness after etching becomes thinner, a radiation loss in the 1st-order horizontal-lateral mode becomes higher, which finding corresponds to FIG. 2. FIG. 18 also shows that as stripe width becomes narrower, a radiation loss in the 1st-order horizontal-lateral mode considerably increases. As for a radiation loss in the basic horizontal-lateral mode, whose plotted graph is not shown, it occurs to the extent that the I-L characteristic is not substantially affected throughout the range shown in FIG. 18.

As a result, it has been found that a higher radiation loss in the 1st-order horizontal-lateral mode inhibits the emergence of the 1st-order horizontal-lateral mode and realizes oscillations in the basic horizontal-lateral mode until output power reaches a high level. Thus, an advantageous effect of the present invention has been proven to be enhanced. It is thus preferable that stripe width and the residual thickness after etching be prepared within the range below the curved line 1801, more preferably below the curved line 1802, and most preferably below the curved line 1803.

The following is an approximation of the curved lines 1801, 1802, and 1803.

Curved line 1801: $(2.1-W) \times (0.1075-d) = 0.0127$
Curved line 1802: $(2.1-W) \times (0.08-d) = 0.0129$
Curved line 1803: $(2.1-W) \times (0.08-d) = 0.0162$
where W [μm] is stripe width and d [μm] is the residual thickness after etching.

To obtain the advantageous effect of the present invention, the W and d are preferably set within a range to meet the following formula.

$$(2.1-W) \times (0.1075-d) \geq 0.0127$$

More preferably, the W and d are set within a range to meet the following formula.

$$(2.1-W) \times (0.08-d) \geq 0.0129$$

Most preferably, the W and d are set within a range to meet the following formula.

$$(2.1-W) \times (0.08-d) \geq 0.0162$$

In this embodiment, although the substrate used is made of n-type GaN, it may be made of other material as long as its refractive index is equal to or more than an effective index against the basic horizontal-lateral mode. Examples of such substrate include an SiC substrate.

As has been described above, in the nitride semiconductor laser element according to the present invention, a propagation loss in a horizontal-lateral mode in accordance with a change in the refractive index of the lower clad layer and in the residual thickness after etching-shows a considerable increase just as a hyperbolic function asymptotic to the longitudinal axis. In addition, there is asymptote displacement between hyperbolic functions of a radiation loss in the basic horizontal-lateral mode and a radiation loss in the 1st-order horizontal-lateral mode. As a result, selective radiation is realized. Specifically, the propagation loss in the basic horizontal-lateral mode is as small as 2 cm$^{-1}$, and the propagation loss in the 1st-order horizontal-lateral mode is higher than that in the basic horizontal-lateral mode by 10 cm$^{-1}$ or more.

It should be noted that though the above description has been about a radiation loss toward the lower clad layer (or the substrate) side, a radiation loss toward the upper clad layer side shows a similar tendency.

In the nitride semiconductor laser element according to the present invention, the refractive index of the lower clad layer is set at a high level (i.e., an Al content is small) as compared with conventional nitride semiconductor laser elements. This spreads the light intensity distribution of the basic horizontal-lateral mode through the lower clad layer side. As a result, the far field pattern (FFP) of emitted light shows a tendency such that the full angle of half maximum in the perpendicular direction narrows. Further, in the nitride semiconductor laser element according to the present invention, the residual thickness after etching is set equal to or thinner than the upper light waveguide layer, as compared with conventional nitride semiconductor laser elements. This spreads the light intensity distribution of the basic horizontal-lateral mode in the horizontal direction. As a result, the far field pattern (FFP) of emitted light shows a tendency such that the full angle of half maximum in the horizontal direction becomes wide. That is, the nitride semiconductor laser element according to the present invention has a benefit of realizing small ellipticity as compared with conventional nitride semiconductor laser elements. When such nitride semiconductor laser element is installed in optical data recording/reproducing devices, the shape of the light collecting spot becomes close to a circle without a molded prism, realizing a benefit of reducing crosstalks.

In the nitride semiconductor laser element according to Embodiment 1, when the content of Al in the n-type clad layer is made smaller, the light intensity distribution of the basic horizontal-lateral mode spreads through the lower clad layer side, making perpendicularly-directed confinement of light small in the basic horizontal-lateral mode. This raises a threshold current density and the operation current power of the semiconductor laser. However, this problem is solved by the nitride semiconductor laser element of the present embodiment. Specifically, in the n-type clad layer, a layer 504 with a lower refractive index than that of the n-type clad layer, i.e., with a higher Al content, is provided at a distance of 0.01 to 0.03 μm from the n-type guiding layer. As a result, a benefit of increasing a coefficient of perpendicularly-directed confinement of light is increased. This increase runs in parallel with the benefits of the present invention including maintaining radiation toward the n-type clad layer side and controlling the FFP so that an increase in half maximum width in the perpendicular direction is minimized. Thus, the nitride semiconductor laser element of the present embodiment excels in performance over the nitride semiconductor laser element of Embodiment 1.

The nitride semiconductor laser element according to Embodiment 2 covers all the features described in first, second, and third aspects of the present invention, thus realizing the objects of the present invention. Further, the refractive index of the substrate is beyond an effective index against the basic horizontal-lateral mode. Such condition is satisfied in this nitride semiconductor laser element.

One hundred pieces of the nitride semiconductor laser element according to Embodiment 2 were fabricated. Ninety pieces of them had consecutive oscillations at room temperature (25° C.) and at a threshold current density of as low as 3.0 kA/cm² in average. Of the nitride semiconductor laser elements fabricated, 80 pieces showed such I-L characteristic that a slope efficiency was 1.4 W/A and maintained oscillations in the basic horizontal-lateral mode until output power reached 100 mW. At an output power of 100 mW, an operational voltage was 4.5 V, an oscillation wavelength was 405 nm, the FFP was such that half maximum width in the perpendicular direction was 16.2 degree and that in the horizontal direction was 9.9 degree, thus realizing an ellipticity of 1.6.

Embodiment 3

A nitride semiconductor laser element according to Embodiment 3 is of the same structure as that of the nitride semiconductor laser element shown in FIG. 1. However, the content of Al in the upper clad layer is higher than that in the lower clad layer. That is, the refractive index of the upper clad layer is lower than that of the lower clad layer. For example, the lower clad layer is made of n-type $Al_{0.06}Ga_{0.94}N$ while the upper clad layer is made of p-type $Al_{0.10}Ga_{0.90}N$.

The fabrication method of the nitride semiconductor laser element according to the Embodiment 3 is the same as that of the nitride semiconductor laser element according to the Embodiment 1, except that there is an asymmetric Al content between the clad layer and the n-type clad layer, and therefore will not be elaborated upon here.

That the refractive index of the upper clad layer is smaller than that of the lower clad layer moves the entire light distribution in a laser oscillation mode toward the lower clad layer side. This result in a bigger difference in a radiation loss toward the lower clad layer between the basic horizontal-lateral mode and the 1st-order horizontal-lateral mode. Thus, high-yield preparation of semiconductor laser elements that maintain the basic horizontal-lateral mode until output power reaches a high level is enabled. In addition, the ellipticity of laser beams is made close to 1.

Figure 19:
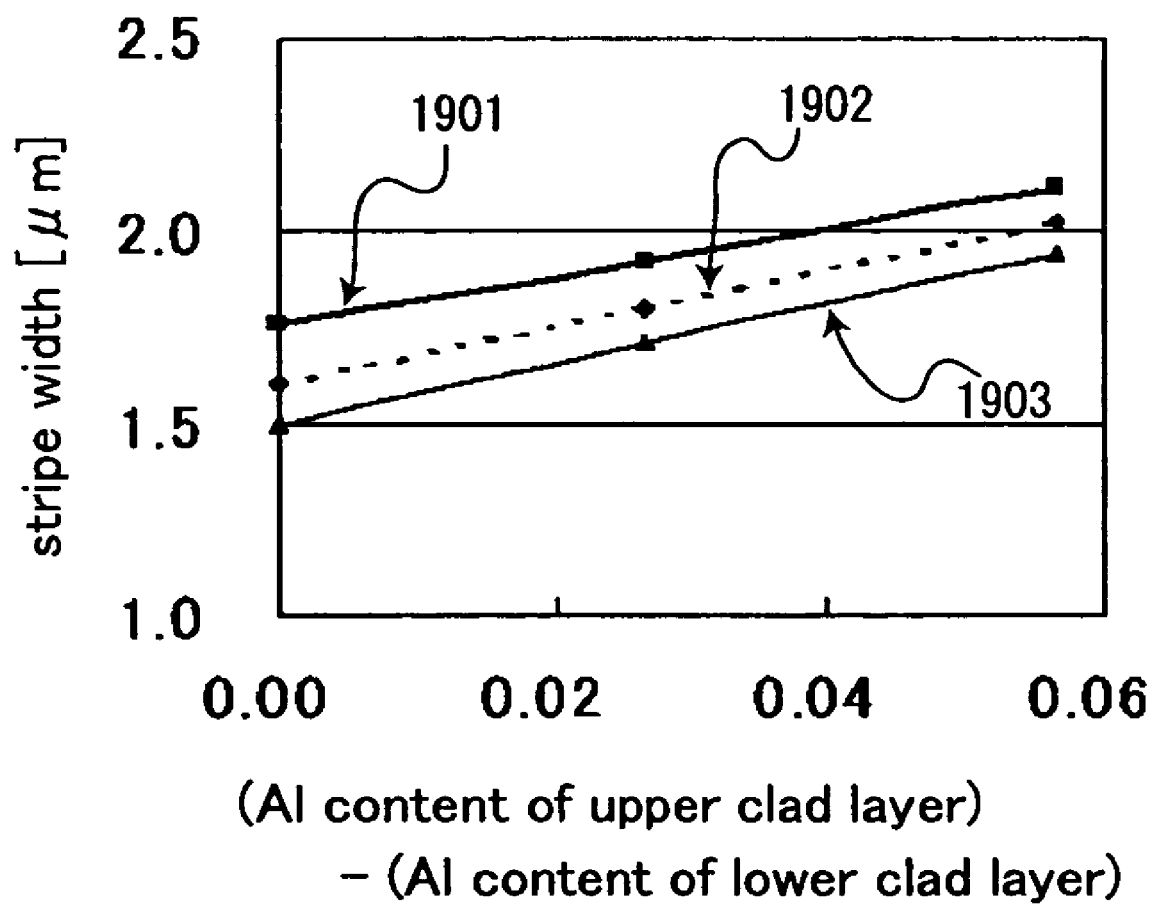
FIG. 19 is a plotted graph of a radiation loss in the 1st-order horizontal-lateral mode in accordance with a change in a value shown in the horizontal axis that is obtained by subtracting an Al content of the lower clad layer from that of the upper clad layer and a change in stripe width shown in the vertical axis, in a semiconductor laser element of the present invention.

FIG. 19 is a plotted graph of a radiation loss in the 1st-order horizontal-lateral mode in accordance with a change in a value shown in the horizontal axis that is obtained by subtracting an aluminum (Al) atom content of the lower clad layer from an aluminum (Al) atom content of the upper clad layer and a change in stripe width shown in the vertical axis, in the semiconductor laser element of the present embodiment. The curved lines 1901, 1902, and 1903 respectively denote the points where a radiation loss in the 1st-order horizontal-lateral mode is 10 cm$^{-1}$, 50 cm$^{-1}$, and 100 cm$^{-1}$. FIG. 19 shows that with an increase in a value obtained by subtracting an aluminum (Al) atom content of the lower clad layer from an aluminum (Al) atom content of the upper clad layer, a radiation loss in the 1st-order horizontal-lateral mode increases. FIG. 19 also shows that with a decrease in stripe width, a radiation loss in the 1st-order horizontal-lateral mode increases considerably. As for a radiation loss in the basic horizontal-lateral mode, whose plotted graph is not shown, it occurs to the extent that the I-L characteristic is not substantially affected throughout the range shown in FIG. 19.

As a result, it has been found that a higher radiation loss in the 1st-order horizontal-lateral mode inhibits the emergence of the 1st-order horizontal-lateral mode and realizes oscillations in the basic horizontal-lateral mode until output power reaches a high level. Thus, an advantageous effect of the present invention has been proven to be enhanced. It is thus preferable that stripe width and a value obtained by subtracting an aluminum (Al) atom content of the lower clad layer from an aluminum (Al) atom content of the upper clad layer be prepared within the range below the curved line 1901, more preferably below the curved line 1902, and most preferably below the curved line 1903.

The following is an approximation of the curved lines 1901, 1902, and 1903.

Curved line 1901: $W=6.1586 \times \Delta x+1.7625$

Curved line 1902: $W=7.4186 \times \Delta x+1.6009$

Curved line 1903: $W=7.9586 \times \Delta x+1.4959$ where W [μm] is stripe width and $\Delta x$ [μm] is a value obtained by subtracting an aluminum (Al) atom content of the lower clad layer from an aluminum (Al) atom content of the upper clad layer.

To obtain the advantageous effect of the present invention, the W and Δx are preferably set within a range to meet the following formula.

$$W<6.1586\times\Delta x+1.7625$$

More preferably, the W and Δx are set within a range to meet the following formula.

$$W<7.4186\times\Delta x+1.6009$$

Most preferably, the W and Δx are set within a range to meet the following formula.

$$W<7.9586\times\Delta x+1.4959$$

In this embodiment, although an Al content of the upper clad layer and an Al content of the lower clad layer are asymmetric, the same advantageous effect as that of Embodiment 3 is obtained with elements in which a refractive index distribution in the perpendicular structure is asymmetric in the direction to promote a radiation loss toward the clad layer side. Examples of such elements, with which to obtain the same advantageous effect as that of the nitride semiconductor laser element of Embodiment 3, include those that set the lower clad layer thinner than the upper clad layer, and those that set the refractive index of the lower clad layer higher than that of the upper clad layer.

Although the nitride semiconductor laser element according to Embodiment 3 has its basis in the nitride semiconductor laser element according to Embodiment 1, basis may be switched to the nitride semiconductor laser element according to Embodiment 2, where the same advantageous effect as above is obtained.

Embodiment 4

The structure of an element according to Embodiment 4 is as follows. An adsorption layer that is distant from the lower light waveguide layer is provided at the lower clad layer side in the nitride semiconductor laser element according to Embodiment 2 shown in FIG. 5. In Embodiment 4, more of the light electric field distribution (light intensity distribution) of the 1st-order horizontal-lateral mode overlaps with the adsorption layer than the light electric field distribution of the basic horizontal-lateral mode. Therefore, a propagation loss by light adsorption of the adsorption layer is bigger in the 1st-order horizontal-lateral mode than in the basic horizontal-lateral mode.

That is, in addition to a difference in a radiation loss toward the lower clad layer between the basic horizontal-lateral mode and the 1st-order horizontal-lateral mode, there is a propagation-loss difference resulting from a mode dependency of a propagation loss by light absorption. Thus, a large difference of losses depending on a mode is secured. This gives wide range of tolerance to the residual thickness after etching.

This advantageous effect is obtained with an element in which the absorption layer is situated closer to the substrate side than to the lower light waveguide layer side, and the distance between the absorption layer and the lower light waveguide layer is more than 0. If, however, the absorption layer and the lower light waveguide layer are excessively distant from each other, less of the light electric field distributions of the basic and 1st-order horizontal-lateral modes overlaps with the absorption layer, which reduction is more likely for the 1st-order horizontal-lateral mode. That is, a difference in a propagation loss by light absorption becomes smaller, accordingly making the advantageous effect of the present invention smaller. Thus, the distance between the absorption layer and the lower light waveguide layer is preferably 0.01–5.0 μm. More specifically, the absorption layer is provided preferably between the first lower clad layer and the second lower clad layer, or between the second lower clad layer and the third lower clad layer. Provision between the second lower clad layer and the third lower clad layer is more preferred.

Figure 9:
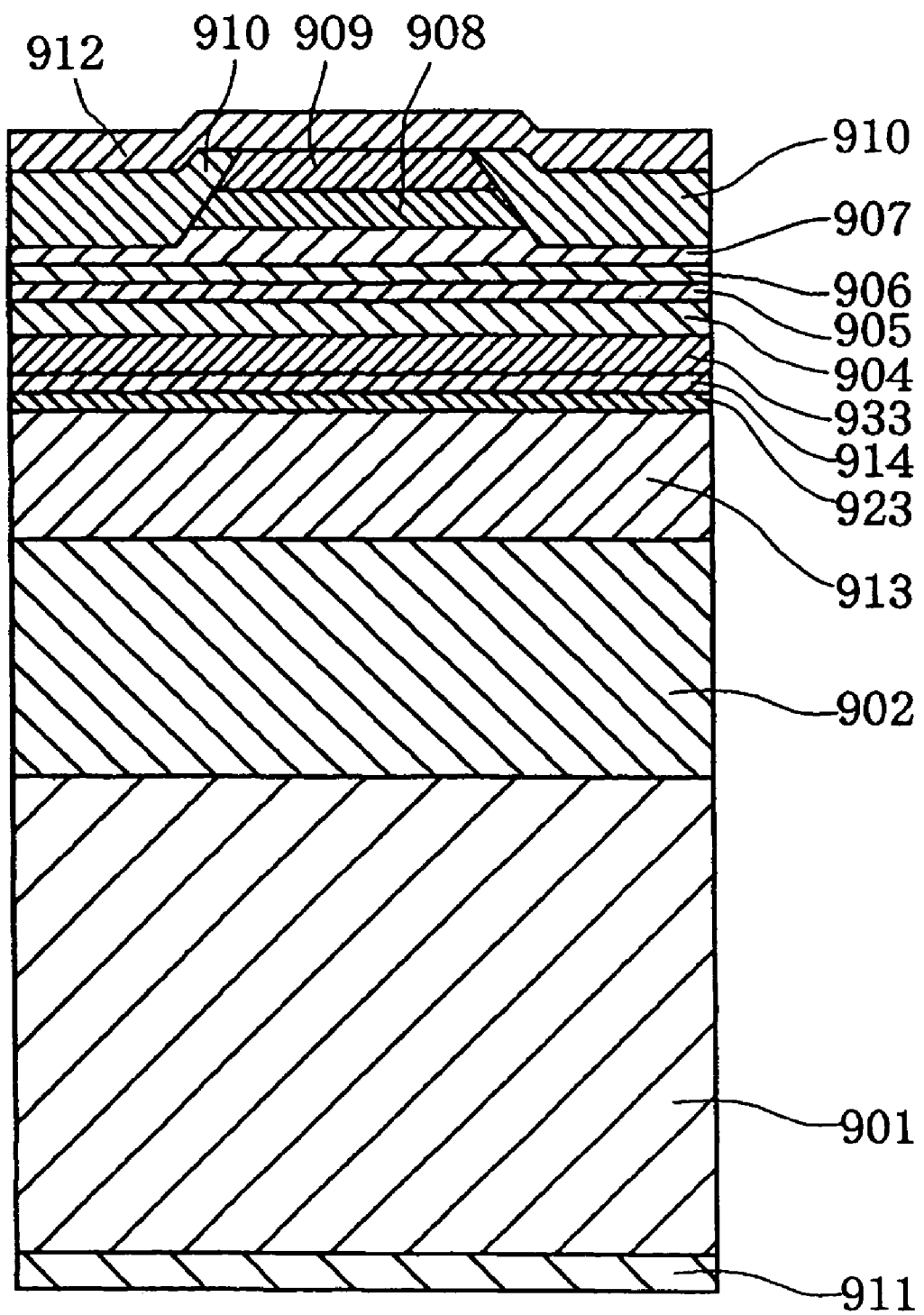
FIG. 9 is a schematic sectional view of a nitride semiconductor laser element having an absorption layer to show another example of the structure thereof.

FIG. 9 is a schematic sectional view of a nitride semiconductor laser element having an absorption layer to show another example of the structure thereof. In the nitride semiconductor laser element shown in FIG. 9, an absorption layer 914 is provided between a second clad layer 923 and a third lower clad layer 933.

The above advantageous effect is obtained with an element in which the absorption coefficient of the absorption layer is 100 cm$^{-1}$ or more. Examples of such absorption layer include a heavily doped layer, a co-doped layer, and an InGaN layer.

Instead of providing an adsorption layer in obtaining the above advantageous effect, a high absorption coefficient may be imparted to the substrate, in which case the structure of the laser element is simplified. Although the nitride semiconductor laser element according to Embodiment 4 has its basis in the nitride semiconductor laser element according to Embodiment 2, basis may be switched to the nitride semiconductor laser element according to Embodiment 1, where the same advantageous effect as above is obtained.

Embodiment 5

Figure 10:
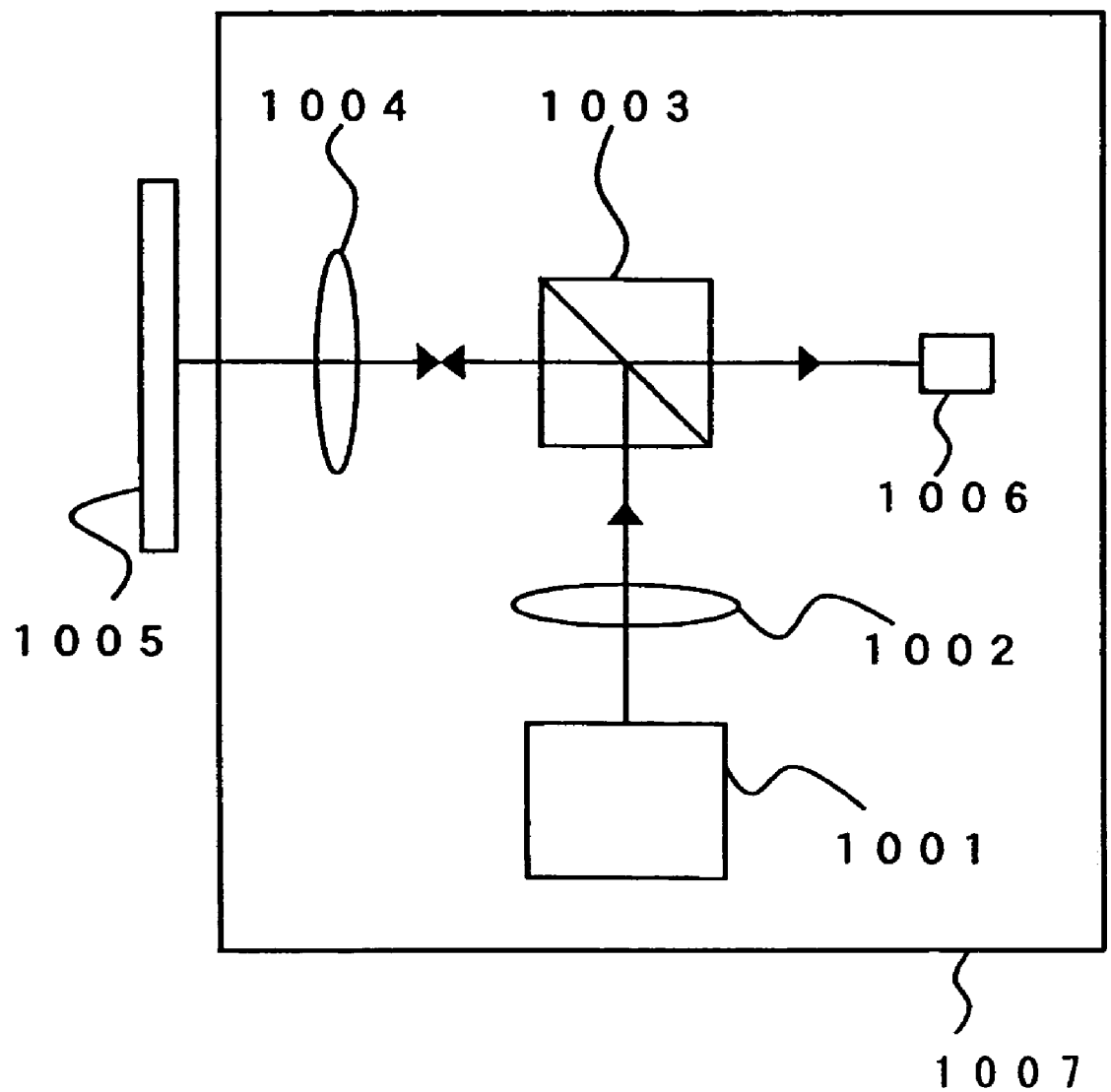
FIG. 10 is a schematic view of an optical data recording/reproducing device of the present invention illustrating the propagation passage of a laser beam for recording in the recording operation, the propagation passage of light for reproducing in the reproducing operation, the propagation passage of light for erasing in the erasing operation, and the optical system.
Figure 11:
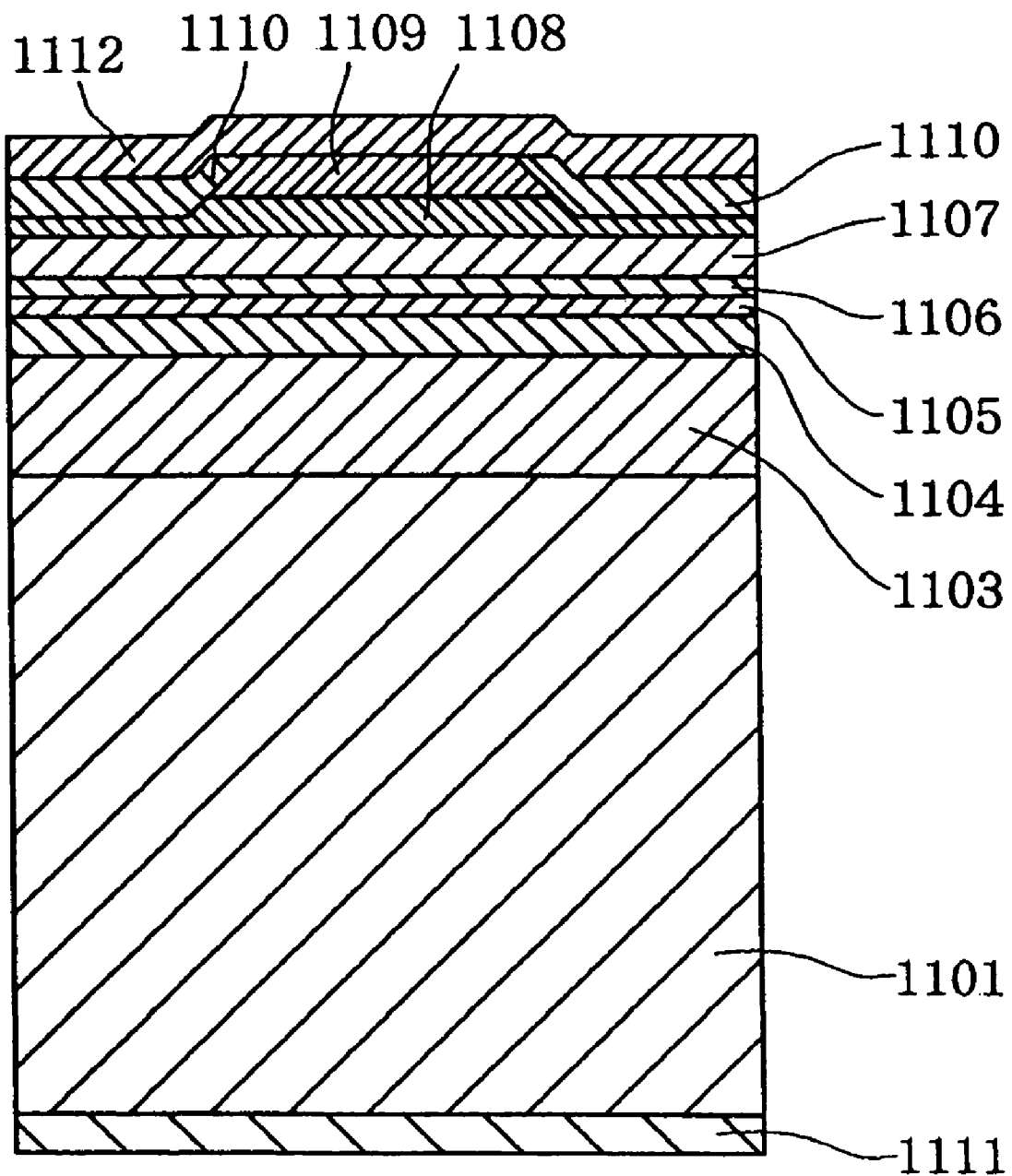
FIG. 11 is a schematic sectional view of a conventional semiconductor laser element showing the structure thereof.

An erasable-type optical data recording/reproducing device according to Embodiment 5 has the nitride semiconductor laser element of-the present invention serving as a light source for recording light. Other than the light source, the structure of this device is well known. FIG. 10 is a schematic view of an optical data recording/reproducing device of the present invention illustrating the propagation passage of a laser beam for recording in the recording operation, the propagation passage of light for reproducing in the reproducing operation, the propagation passage of light for erasing in the erasing operation, and the optical system.

An optical data recording/reproducing device 1007 has a nitride semiconductor laser element 1001 according to the present invention, radiating control means (not shown), a collimating lens 1002, a beam splitter 1003, an objective lens (light collecting means) 1004, irradiating position control means (not shown), and a light detecting system (light detecting means) 1006 to detect light. For simplicity, in FIG. 10, portions (means) unnecessary for describing the present invention are omitted.

In the optical data recording/reproducing device 1007, the nitride semiconductor laser element 1001 serves as the light sources for recording, reproduction, and erasure. The radiating control means is capable of allowing light radiation of different power levels, and in the reproduction operation, capable of allowing light radiation of a lower power level than the power levels of light for recording and erasing.

In the recording and erasing operations, a laser beam emitted from the nitride semiconductor laser device is converted into parallel light or nearly parallel light by the collimating lens. Passing through the beam splitter, this light is collected by the objective lens to the data recording surface of a light disk 1005 (light recording medium). On the data recording surface of the light disk, bit data is written with magnetic modulation or refractive index modulation. In the reproducing operation, through the same passage as the recording and erasing operations, a laser beam emitted from the semiconductor laser device is collected to the data recording surface of the light disk on which bit data is written with the projections and depressions, and magnetic modulation or refractive index modulation. Then, the collected laser beam is reflected by the light disk and transmitted through the objective lens and the beam splitter, before entry into the light detecting system. The light detecting system optically detects a signal, converts it into an electrical signal, and reads the recorded data.

The optical data recording/reproducing device having the semiconductor laser element according to the present invention has accomplished a defect rate of $10^{-6}$ or less in the recording operation. Also, in the reproducing operation, this device read written data with a bit reading error rate of $10^{-6}$.

On the other hand, an optical data recording/reproducing device having a conventional nitride semiconductor laser element that did not fall within the present invention had a defect rate of the order of $10^{-3}$ in the recording operation and a bit reading error rate of the order of $10^{-3}$ in the reproducing operation. This difference is attributed to the fact that the optical data recording/reproducing device of the present invention used the semiconductor laser element that maintains oscillations in the basic horizontal-lateral mode until output power reaches a high level, and whose I-L characteristic does not suffer kink until output power reaches a high level. By using such element, the output power of a laser beam collected on the light disk was kept stable at a high level.

Figure 17:
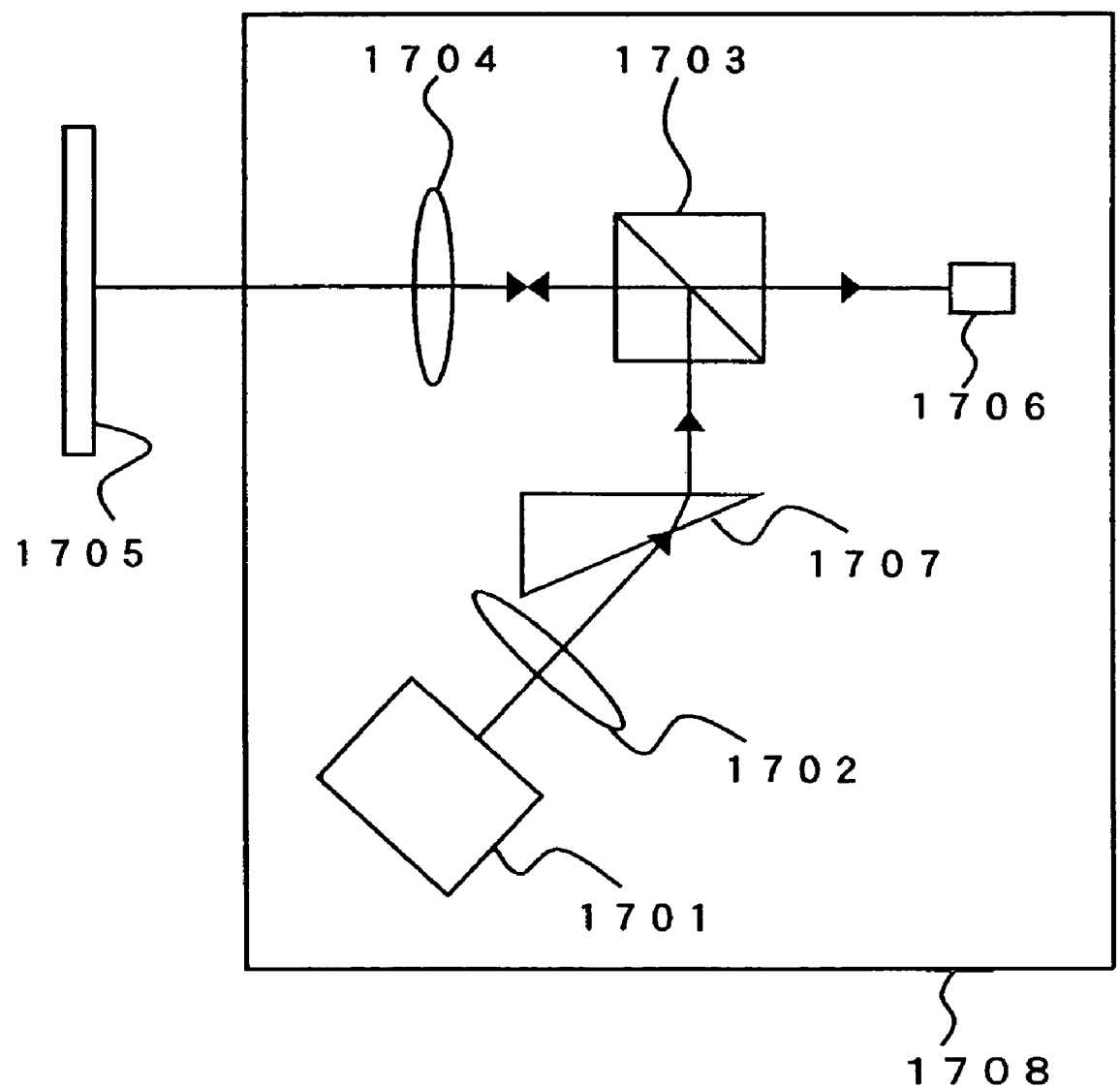
FIG. 17 is a schematic view of the basic configuration of a conventional optical data recording/reproducing device.

The semiconductor laser element according to the present invention, where the FFP has an ellipticity of close to 1, does not need the molded prism 1707 unlike the conventional optical data recording/reproducing device shown in FIG. 17. Thus reducing the number of members, the optical data recording/reproducing device of the present invention realizes cost reduction and miniaturization, as compared with conventional optical data recording/reproducing devices.

As has been described above, with the semiconductor laser element according to the first aspect of the present invention, light in the 1st-order horizontal-lateral mode is given priority, over light in the basic horizontal-lateral mode, of radiation outside the clad layer that meets the following requirements. Such semiconductor laser element comprises a substrate, a lower clad layer, an upper clad layer, and an active layer, and has a ridge-stripe structure formed. In this semiconductor laser element, in at least either the lower clad layer or the upper clad layer, a difference in a radiation loss of light, generated in the active layer, toward the main side opposite to the active layer side between the basic horizontal-lateral mode and the 1st-order horizontal-lateral mode is 10 cm$^{-1}$ or more.

Also, with the semiconductor laser element according to the second aspect of the present invention, light in the 1st-order horizontal-lateral mode is given priority, over light in the basic horizontal-lateral mode, of radiation outside the clad layer that meets the following requirements. Such semiconductor laser element comprises a substrate, a lower clad layer, an upper clad layer, and an active layer, and has a ridge-stripe structure formed. In this semiconductor laser element, the refractive index of at least either the lower clad layer or the upper clad layer is below an effective index against light, generated in the active layer, in the basic horizontal-lateral mode, and the refractive index is equal to or more than the effective index against light, generated in the active layer, in the 1st-order horizontal-lateral mode.

Also, with the semiconductor laser element according to the third aspect of the present invention, light in the 1st-order horizontal-lateral mode is given priority, over light in the basic horizontal-lateral mode, of radiation outside the lower clad layer. Such semiconductor laser element comprises a substrate, a lower clad layer, an upper clad layer, and an active layer, and has a ridge-stripe structure formed. In this semiconductor laser element, the upper clad layer is provided above a portion of the active layer, thus constituting at least a portion of the ridge-stripe structure.

When installing the semiconductor laser element according to the present invention in optical data recording/reproducing devices, data is recorded and reproduced with high speed and high accuracy. With the light collecting spot made close to a circular shape without a molded prism, such devices reduce crosstalks. Also when installing the semiconductor laser element according to the present invention in optical data recording/reproducing devices, data is recorded and reproduced with high recording density, high speed, and high accuracy.

What is claimed is:

1. A semiconductor laser element having a ridge-stripe structure for confining light in a horizontal direction, the element comprising: a substrate; a first conductivity type lower clad layer formed above the substrate; a second conductivity type upper clad layer formed above the lower clad layer, the second conductivity type being different from the first conductivity type; and an active layer provided between the lower clad layer and the upper clad layer, the element wherein,
    a difference in a radiation loss of light between a basic horizontal-lateral mode and a 1st-order horizontal-lateral mode is 10 cm$^{-1}$ or more, the light generated in the active layer, the propagation loss of light directed toward a main side of at least either the lower clad layer or the upper clad layer, the main side being opposite to an active layer side of the lower clad layer or the upper clad layer.

2. A semiconductor laser element according to claim 1 wherein,
    a refractive index of at least either the lower clad layer or the upper clad layer of the semiconductor laser element is below an effective index against light in a basic horizontal-lateral mode, and equal to or more than an effective index against light in a 1st-order horizontal-lateral mode, the light generated in the active layer.

3. The semiconductor laser element according to claim 1, wherein,
    the upper clad layer is provided above a portion of the active layer, and the upper clad layer is at least included in the ridge-stripe structure.

4. The semiconductor laser element according to claim 3, further comprising a second conductivity type upper light waveguide layer provided between the active layer and the upper clad layer, the upper light waveguide layer having a stripe-shaped protruding portion, wherein,
    the stripe-shaped protruding portion of the upper light waveguide layer is included in the ridge-stripe structure.

5. The semiconductor laser element according to claim 4, wherein the lower clad layer, the upper clad layer, and the active layer are made of nitride semiconductors.

6. The semiconductor laser element according to claim 5, wherein:
    the lower clad layer includes a first conductivity type first lower clad layer, a first conductivity type second lower clad layer, and a first conductivity type third lower clad layer, the lower clad layers deposited in this order from a side of the substrate;
    a refractive index of the lower clad layer is a weighted average value of a refractive index of the first lower clad layer, a refractive index of the second lower clad layer, and a refractive index of the third lower clad layer, the weighted average value weighted by each thickness of the first, second, and third lower clad layers;

the refractive index of the second lower clad layer is lower than the refractive index of the first lower clad layer and the refractive index of the third lower clad layer; and the refractive index of the first lower clad layer and the refractive index of the third lower clad layer are lower than an effective index against light in a basic horizontal-lateral mode, the light generated in the active layer.

7. The semiconductor laser element according to claim 6, further comprising a first conductivity type lower light waveguide layer between the lower clad layer and the active layer, wherein, a refractive index of the lower light waveguide layer is higher than the refractive index of the first lower clad layer and the refractive index of the third lower clad layer.

8. The semiconductor laser element according to claim 2, wherein, the upper clad layer is provided above a portion of the active layer, and the upper clad layer is at least included in the ridge-stripe structure.

9. The semiconductor laser element according to claim 8, further comprising a second conductivity type upper light waveguide layer provided between the active layer and the upper clad layer, the upper light waveguide layer having a stripe-shaped protruding portion, wherein, the stripe-shaped protruding portion of the upper light waveguide layer is included in the ridge-stripe structure.

10. The semiconductor laser element according to claim 9, wherein the lower clad layer, the upper clad layer, and the active layer are made of nitride semiconductors.

11. The semiconductor laser element according to claim 10, wherein:

the lower clad layer includes a first conductivity type first lower clad layer, a first conductivity type second lower clad layer, and a first conductivity type third lower clad layer, the lower clad layers deposited in this order from a side of the substrate;

a refractive index of the lower clad layer is a weighted average value of a refractive index of the first lower clad layer, a refractive index of the second lower clad layer, and a refractive index of the third lower clad layer, the weighted average value weighted by each thickness of the first, second, and third lower clad layers;

the refractive index of the second lower clad layer is lower than the refractive index of the first lower clad layer and the refractive index of the third lower clad layer; and the refractive index of the first lower clad layer and the refractive index of the third lower clad layer are lower than an effective index against light in a basic horizontal-lateral mode, the light generated in the active layer.

12. The semiconductor laser element according to claim 11, further comprising a first conductivity type lower light waveguide layer between the lower clad layer and the active layer, wherein, a refractive index of the lower light waveguide layer is higher than the refractive index of the first lower clad layer and the refractive index of the third lower clad layer.

13. The semiconductor laser element according to claim 1, wherein a refractive index of the lower clad layer and a refractive index of the upper clad layer are different from each other.

14. The semiconductor laser element according to claim 13, wherein the refractive index of the lower clad layer is higher than the refractive index of the upper clad layer.

15. The semiconductor laser element according to claim 13, further comprising an absorption layer, the absorption layer having an absorption coefficient of 100 cm$^{-1}$ or more with respect to light generated in the active layer, the absorption layer provided at a distance of 0.1 μm or less from a surface of a clad layer, the surface facing a side of the active layer, the clad layer being either the lower clad layer or the upper clad layer and having a higher refractive index than the refractive index of the other clad layer.

16. The semiconductor laser element according to claim 14, wherein a refractive index of the substrate is higher than an effective index against light in a basic horizontal-lateral mode, the light generated in the active layer.

17. The semiconductor laser element according to claim 14, wherein:

the lower clad layer includes a first conductivity type first lower clad layer, a first conductivity type second lower clad layer, and a first conductivity type third lower clad layer, the lower clad layers deposited in this order from a side of the substrate;

a refractive index of the lower clad layer is a weighted average value of a refractive index of the first lower clad layer, a refractive index of the second lower clad layer, and a refractive index of the third lower clad layer, the weighted average value weighted by each thickness of the first, second, and third lower clad layers;

the refractive index of the second lower clad layer is lower than the refractive index of the first lower clad layer and the refractive index of the third lower clad layer; and the refractive index of the first lower clad layer and the refractive index of the third lower clad layer are lower than an effective index against light in a basic horizontal-lateral mode, the light generated in the active layer.

18. The semiconductor laser element according to claim 17, further comprising a first conductivity type lower light waveguide layer between the lower clad layer and the active layer, wherein, a refractive index of the lower light waveguide layer is higher than the refractive index of the first lower clad layer and the refractive index of the third lower clad layer.

19. The semiconductor laser element according to claim 2, wherein a refractive index of the lower clad layer and a refractive index of the upper clad layer are different from each other.

20. The semiconductor laser element according to claim 19, wherein the refractive index of the lower clad layer is higher than the refractive index of the upper clad layer.

21. The semiconductor laser element according to claim 19, further comprising an absorption layer, the absorption layer having an absorption coefficient of 100 cm$^{-1}$ or more with respect to light generated in the active layer, the absorption layer provided at a distance of 0.1 μm or less from a surface of a clad layer, the surface facing a side of the active layer, the clad layer being either the lower clad layer or the upper clad layer and having a higher refractive index than the refractive index of the other clad layer.

22. The semiconductor laser element according to claim 20, wherein a refractive index of the substrate is higher than an effective index against light in a basic horizontal-lateral mode, the light generated in the active layer.

23. The semiconductor laser element according to claim 20, wherein:
the lower clad layer includes a first conductivity type first lower clad layer, a first conductivity type second lower clad layer, and a first conductivity type third lower clad layer, the lower clad layers deposited in this order from a side of the substrate;
a refractive index of the lower clad layer is a weighted average value of a refractive index of the first lower clad layer, a refractive index of the second lower clad layer, and a refractive index of the third lower clad layer, the weighted average value weighted by each thickness of the first, second, and third lower clad layers;
the refractive index of the second lower clad layer is lower than the refractive index of the first lower clad layer and the refractive index of the third lower clad layer; and
the refractive index of the first lower clad layer and the refractive index of the third lower clad layer are lower than an effective index against light in a basic horizontal-lateral mode, the light generated in the active layer.

24. The semiconductor laser element according to claim 23, further comprising a first conductivity type lower light waveguide layer between the lower clad layer and the active layer, wherein,
a refractive index of the lower light waveguide layer is higher than the refractive index of the first lower clad layer and the refractive index of the third lower clad layer.

25. The semiconductor laser element according to claim 1, wherein when a value obtained by subtracting a height of the ridge-stripe structure from a distance between a top of the ridge-stripe structure and the active layer is taken as d [μm], and when a stripe width of the ridge-stripe structure is taken as W [μm], then the d and the W meet the following formula:

$$(2.1-W) \times (0.1075-d) \geq 0.0127.$$

26. The semiconductor laser element according to claim 25, wherein:
the lower clad layer and the upper clad layer are each composed of an alloy layer containing aluminum atoms; and
when a value obtained by subtracting an aluminum atom content of the lower clad layer from an aluminum atom content of the upper clad layer is taken as Δx, then the Δx and the W meet the following formula:

$$W < 6.1586 \times \Delta x + 1.7625.$$

27. The semiconductor laser element according to claim 26, wherein:
the lower clad layer includes a first conductivity type first lower clad layer, a first conductivity type second lower clad layer, and a first conductivity type third lower clad layer, the lower clad layers deposited in this order from a side of the substrate;
a refractive index of the lower clad layer is a weighted average value of a refractive index of the first lower clad layer, a refractive index of the second lower clad layer, and a refractive index of the third lower clad layer, the weighted average value weighted by each thickness of the first, second, and third lower clad layers;
the refractive index of the second lower clad layer is lower than the refractive index of the first lower clad layer and the refractive index of the third lower clad layer; and
the refractive index of the first lower clad layer and the refractive index of the third lower clad layer are lower than an effective index against light in a basic horizontal-lateral mode, the light generated in the active layer.

28. The semiconductor laser element according to claim 27, further comprising a first conductivity type lower light waveguide layer between the lower clad layer and the active layer, wherein,
a refractive index of the lower light wave guide layer is higher than the refractive index of the first lower clad layer and the refractive index of the third lower clad layer.

29. The semiconductor laser element according to claim 2, wherein when a value obtained by subtracting a height of the ridge-stripe structure from a distance between a top of the ridge-stripe structure and the active layer is taken as d [μm], and when a stripe width of the ridge-stripe structure is taken as W [μm], then the d and the W meet the following formula:

$$(2.1-W) \times (0.1075-d) \geq 0.0127.$$

30. The semiconductor laser element according to claim 29, wherein:
the lower clad layer and the upper clad layer are each composed of an alloy layer containing aluminum atoms; and
when a value obtained by subtracting an aluminum atom content of the lower clad layer from an aluminum atom content of the upper clad layer is taken as Δx, then the Δx and the W meet the following formula:

$$W < 6.1586 \times \Delta x + 1.7625.$$

31. The semiconductor laser element according to claim 30, wherein:
the lower clad layer includes a first conductivity type first lower clad layer, a first conductivity type second lower clad layer, and a first conductivity type third lower clad layer, the lower clad layers deposited in this order from a side of the substrate;
a refractive index of the lower clad layer is a weighted average value of a refractive index of the first lower clad layer, a refractive index of the second lower clad layer, and a refractive index of the third lower clad layer, the weighted average value weighted by each thickness of the first, second, and third lower clad layers;
the refractive index of the second lower clad layer is lower than the refractive index of the first lower clad layer and the refractive index of the third lower clad layer; and
the refractive index of the first lower clad layer and the refractive index of the third lower clad layer are lower than an effective index against light in a basic horizontal-lateral mode, the light generated in the active layer.

32. The semiconductor laser element according to claim 31 further comprising a first conductivity type lower light waveguide layer between the lower clad layer and the active layer, wherein,
a refractive index of the lower light waveguide layer is higher than the refractive index of the first lower clad layer and the refractive index of the third lower clad layer.

33. An optical data recording device for recording data in a light recording medium, the data provided in an electrical signal, the device comprising:
a semiconductor laser element having a ridge-stripe structure for confining light in a horizontal direction;

recording light radiating control means for allowing radiation of a laser beam for recording from the semiconductor laser element in accordance with the electrical signal;

light focusing means for focusing a laser beam radiated from the semiconductor laser element; and irradiating position control means for recording data by irradiating a particular position of a light recording medium with a laser beam collected by the light collecting means, wherein:

the semiconductor laser element comprises: a substrate; a first conductivity type lower clad layer formed above the substrate; a second conductivity type upper clad layer formed above the lower clad layer, the second conductivity type being different from the first conductivity type; and an active layer provided between the lower clad layer and the upper clad layer, the element wherein, in at least either the lower clad layer or the upper clad layer, a difference in a radiation loss of light between a basic horizontal-lateral mode and a 1st-order horizontal-lateral mode is 10 cm$^{-1}$ or more, the light generated in the active layer, the propagation loss of light directed toward a main side of at least either the lower clad layer or the upper clad layer, the main side being opposite to an active layer side of the lower clad layer or the upper clad layer.

34. The optical data recording device according to claim 33 wherein, a refractive index of at least either the lower clad layer or the upper clad layer of the semi-conductor laser is below an effective index against light in a basic horizontal-lateral mode, and equal to or more than an effective index against light in a 1st-order horizontal-lateral mode, such light generated in the active layer.

35. The optical data recording device according to claim 33, further comprising:

a reproduction-only light source for radiating light for reproduction;

reproduction light radiating control means for allowing radiation of the light for reproduction from the reproduction-only light source in accordance with a reproduction command signal;

reproduction-only light focusing means for focusing light radiated from the reproduction-only light source;

reproduction light irradiating position control means for irradiating a particular position of the light recording medium with light collected by the light collecting means;

light detecting means for detecting light reflected by the light recording medium or light transmitting through the light recording medium; and light electrical conversion means for reproducing data recorded in the light recording medium by converting an optical signal detected by the light detecting means into an electrical signal.

36. The optical data recording device according to claim 33, further comprising:

an erasing-only light source for radiating light for erasing;

erasing light radiating control means for allowing radiation of light for erasing from the erasing-only light source in accordance with an erasing command signal;

erasing-only light focusing means for focusing light radiated from the erasing-only light source; and erasing light irradiating position control means for erasing recorded data by irradiating a particular position of a light recording medium with light collected by the light collecting means.

37. The optical data recording device according to claim 34, further comprising:

a reproduction-only light source for radiating light for reproduction;

reproduction light radiating control means for allowing radiation of the light for reproduction from the reproduction-only light source in accordance with a reproduction command signal;

reproduction-only light focusing means for focusing light radiated from the reproduction-only light source;

reproduction light irradiating position control means for irradiating a particular position of the light recording medium with light collected by the light collecting means;

light detecting means for detecting light reflected by the light recording medium or light transmitting through the light recording medium; and light electrical conversion means for reproducing data recorded in the light recording medium by converting an optical signal detected by the light detecting means into an electrical signal.

38. The optical data recording device according to claim 34, further comprising:

an erasing-only light source for radiating light for erasing;

erasing light radiating control means for allowing radiation of light for erasing from the erasing-only light source in accordance with an erasing command signal;

erasing-only light focusing means for focusing light radiated from the erasing-only light source; and erasing light irradiating position control means for erasing recorded data by irradiating a particular position of a light recording medium with light collected by the light collecting means.

* * * * *